United States Patent
Cheung et al.

(10) Patent No.: US 12,250,818 B2
(45) Date of Patent: Mar. 11, 2025

(54) METHODS OF FORMING CHARGE-BLOCKING MATERIAL, AND INTEGRATED ASSEMBLIES HAVING CHARGE-BLOCKING MATERIAL

(71) Applicant: Micron Technology, Inc., Boise, ID (US)

(72) Inventors: Pei Qiong Cheung, Singapore (SG); Zhixin Xu, Singapore (SG); Yuan Fang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 387 days.

(21) Appl. No.: 17/586,682

(22) Filed: Jan. 27, 2022

(65) Prior Publication Data

US 2022/0157850 A1 May 19, 2022

Related U.S. Application Data

(62) Division of application No. 16/704,176, filed on Dec. 5, 2019, now Pat. No. 11,271,006.

(51) Int. Cl.
*H10B 43/27* (2023.01)
*H10B 43/10* (2023.01)

(52) U.S. Cl.
CPC ............. *H10B 43/27* (2023.02); *H10B 43/10* (2023.02)

(58) Field of Classification Search
CPC ................................. H10B 43/27; H10B 43/20
See application file for complete search history.

(56) References Cited

U.S. PATENT DOCUMENTS

| 10,446,578 B1 * | 10/2019 | Howder ................. H10B 41/30 |
| 2013/0187217 A1 | 7/2013 | Mizushima |
| 2014/0264525 A1 | 9/2014 | Takahashi |

(Continued)

FOREIGN PATENT DOCUMENTS

| CN | 108831887 | 11/2018 |
| TW | 201913962 | 4/2019 |

(Continued)

OTHER PUBLICATIONS

WO PCT/US2020/058754 IPRP, Jun. 17, 2022, Micron Technology, Inc.

*Primary Examiner* — Christopher A Johnson
(74) *Attorney, Agent, or Firm* — Wells St. John P.S.

(57) ABSTRACT

Some embodiments include a method of forming an assembly. A first stack of alternating first and second tiers is formed over a conductive structure. A first opening is formed to extend through the first stack. A sidewall of the first opening is lined with a first liner material. The first liner material is converted to a first charge-blocking material. Sacrificial material is formed within the first opening. A second stack of alternating third and fourth tiers is formed over the first stack. A second opening is formed to extend through the second stack to the sacrificial material. A second liner material is formed within the second opening, is anisotropically etched, and is then converted to a second charge-blocking material. The sacrificial material is removed. Charge-storage material, dielectric material and channel material are formed adjacent to the charge-blocking material. Some embodiments include integrated assemblies.

10 Claims, 26 Drawing Sheets

(56) References Cited

U.S. PATENT DOCUMENTS

| | | | |
|---|---|---|---|
| 2016/0204117 A1 | 7/2016 | Liu | |
| 2017/0062454 A1 | 3/2017 | Lu | |
| 2017/0179148 A1 | 6/2017 | Kwon et al. | |
| 2017/0200737 A1 | 7/2017 | Sun et al. | |
| 2017/0243879 A1 | 8/2017 | Yu et al. | |
| 2017/0373086 A1 | 12/2017 | Pang | |
| 2018/0122904 A1 | 5/2018 | Matsumoto et al. | |
| 2019/0067324 A1 | 2/2019 | Zhang | |
| 2019/0081061 A1 | 3/2019 | Tessariol | |
| 2019/0280000 A1 | 9/2019 | Nakamura | |
| 2020/0020713 A1 | 1/2020 | Choi | |
| 2020/0083248 A1 | 3/2020 | Uchida | |
| 2020/0266202 A1* | 8/2020 | Kwon | ................ H01L 29/7889 |

FOREIGN PATENT DOCUMENTS

| | | |
|---|---|---|
| TW | 109140669 | 7/2021 |
| WO | WO PCT/US2020/058754 | 2/2021 |

\* cited by examiner

METHODS OF FORMING CHARGE-BLOCKING MATERIAL, AND INTEGRATED ASSEMBLIES HAVING CHARGE-BLOCKING MATERIAL

RELATED PATENT DATA

This patent resulted from divisional application of U.S. patent application Ser. No. 16/704,176, filed Dec. 5, 2019, the disclosures of which are incorporated herein by reference.

TECHNICAL FIELD

Integrated assemblies (e.g., assemblies including integrated memory). Methods of forming integrated assemblies. Methods of forming charge-blocking material associated with integrated memory.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Memory may be fabricated in decks, and two or more decks may be stacked one atop another. Stress may occur along the stacked decks, leading to buckling or other problematic distortions of materials associated with the decks. It would be desirable to develop improved methods of fabricating stacked memory decks which alleviate the problematic stresses.

DETAILED DESCRIPTION OF THE ILLUSTRATED EMBODIMENTS

Some embodiments include methods of forming multi-deck memory arrangements in which sacrificial material having tensile stress (example tensile-stress-materials include aluminum oxide, tungsten, etc.) is provided within an opening extending through a first deck to balance problematic stresses while an additional deck is formed over the first deck and patterned. In some embodiments, a first portion of a charge-blocking structure may be formed along sidewalls of the opening prior to providing the sacrificial material within the opening. Subsequently, a second opening may be formed to extend through the additional deck to the sacrificial material, a second portion of the charge-blocking structure may be formed along sidewalls of the second opening, and then the sacrificial material may be removed. Example embodiments are described with reference to FIGS. 5-26.

Figure 1:
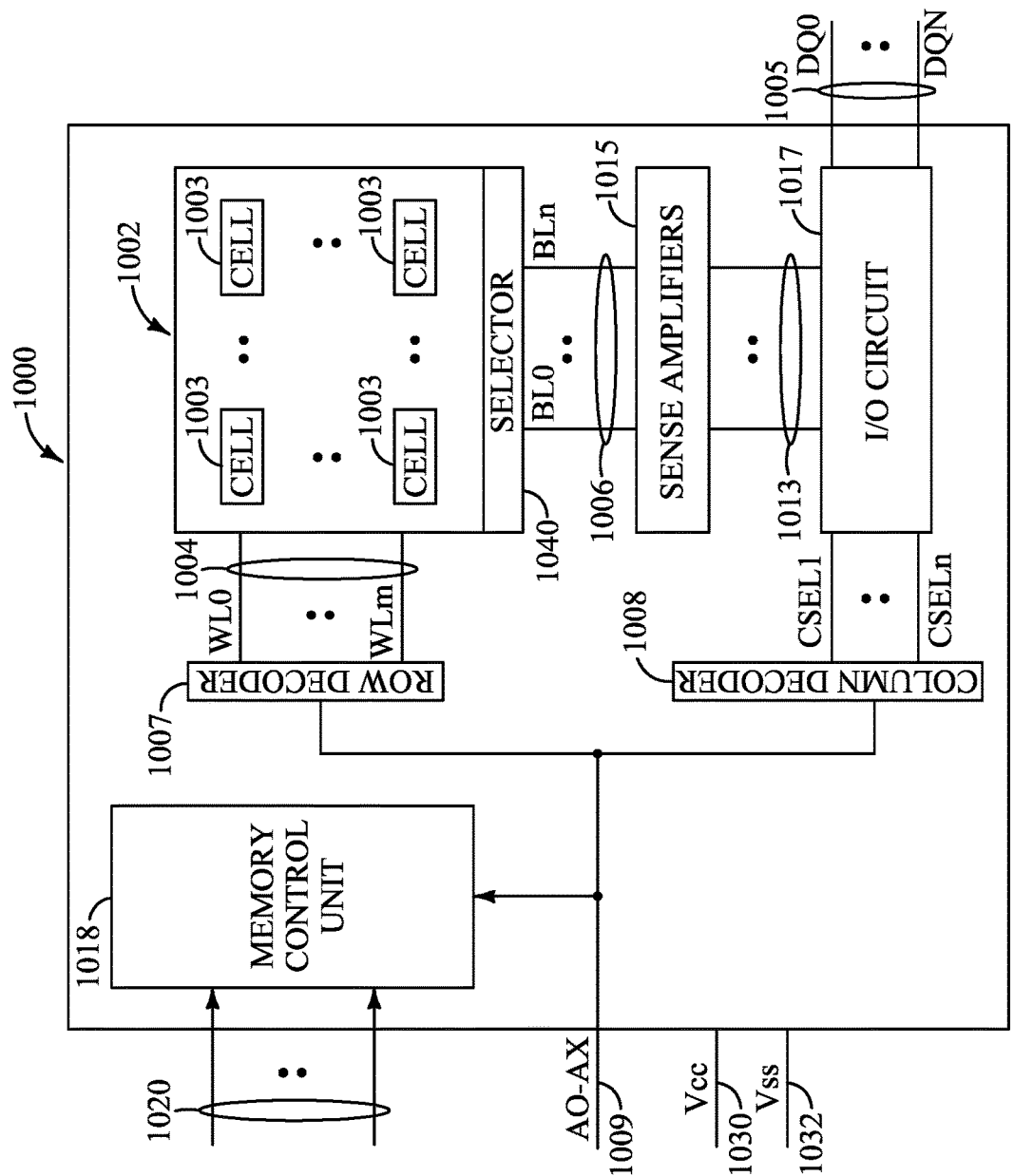
FIG. 1 shows a block diagram of a prior art memory device having a memory array with memory cells.
Figure 2:
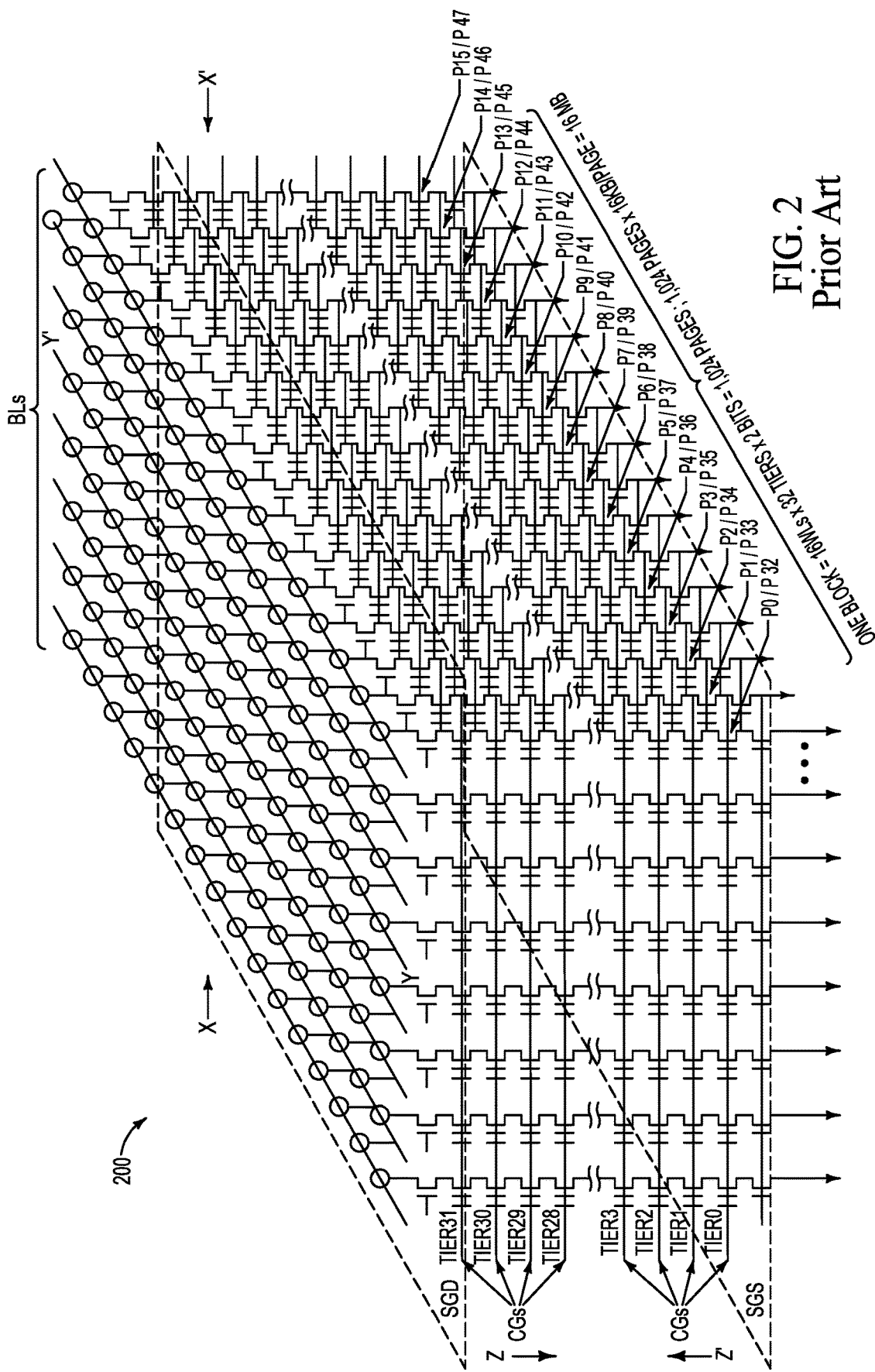
FIG. 2 shows a schematic diagram of the prior art memory device of FIG. 1 in the form of a 3D NAND memory device.
Figure 3:
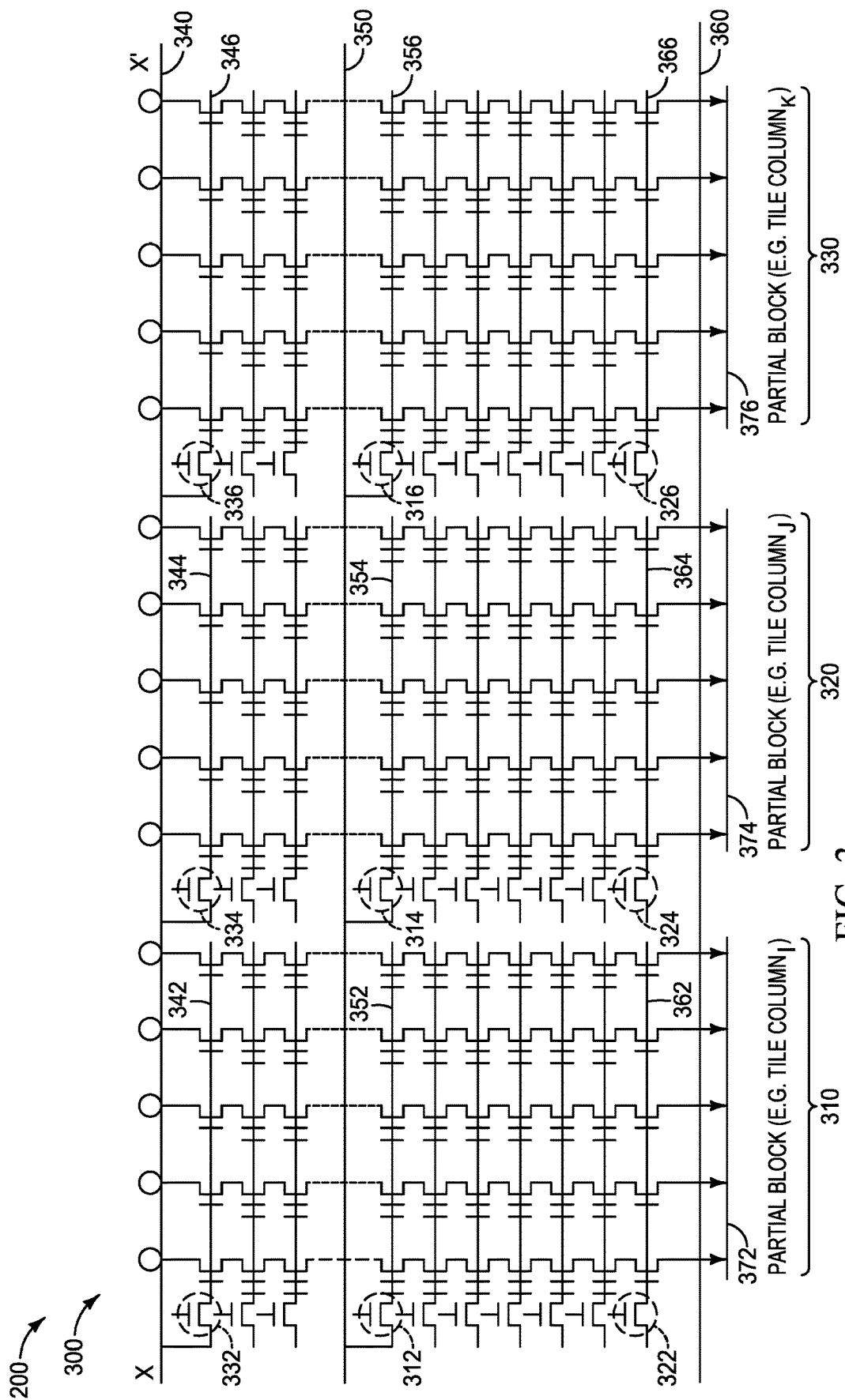
FIG. 3 shows a cross-sectional view of the prior art 3D NAND memory device of FIG. 2 in an X-X' direction.
Figure 4:
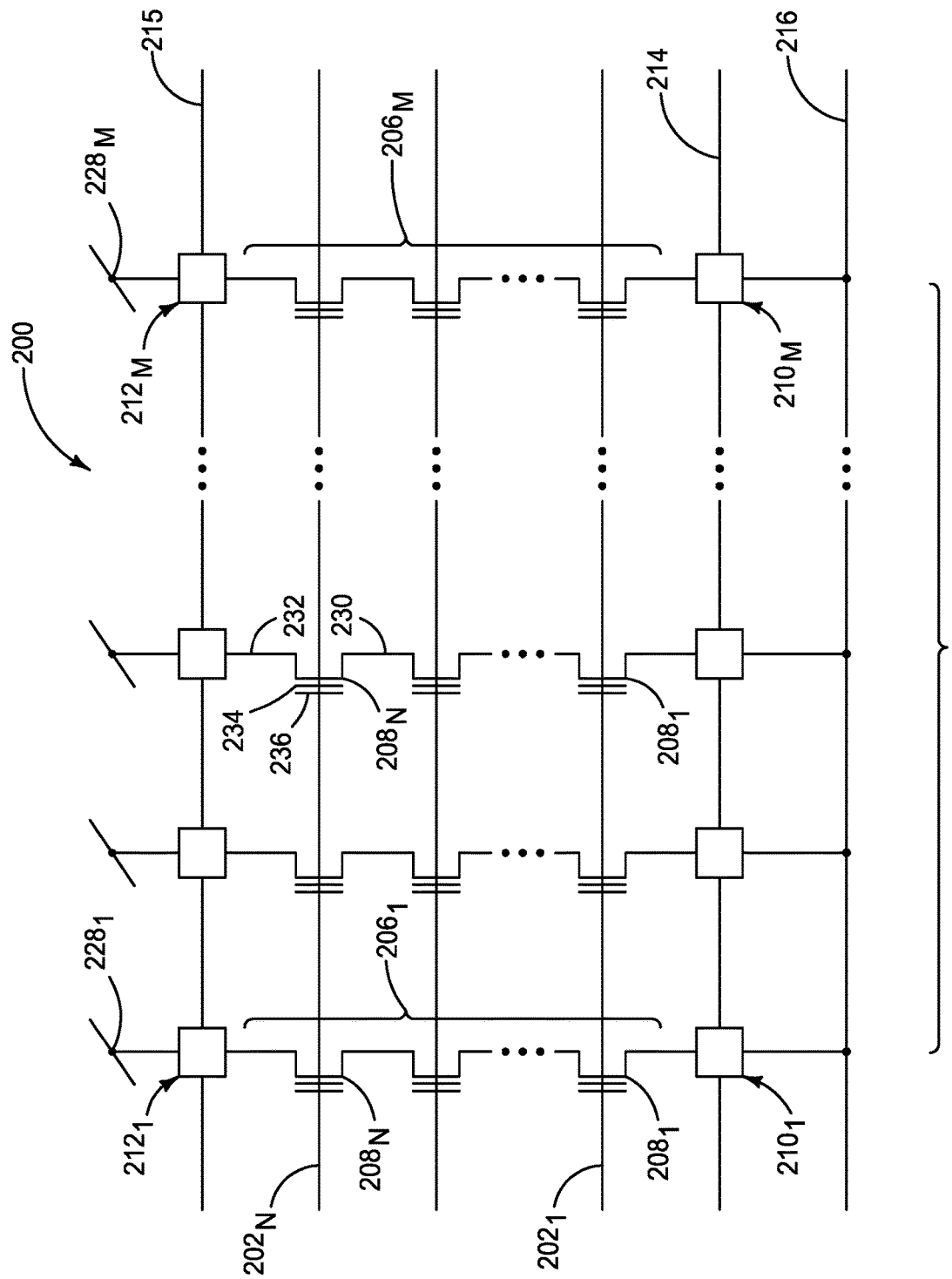
FIG. 4 is a schematic diagram of a prior art NAND memory array.
Figure 5:
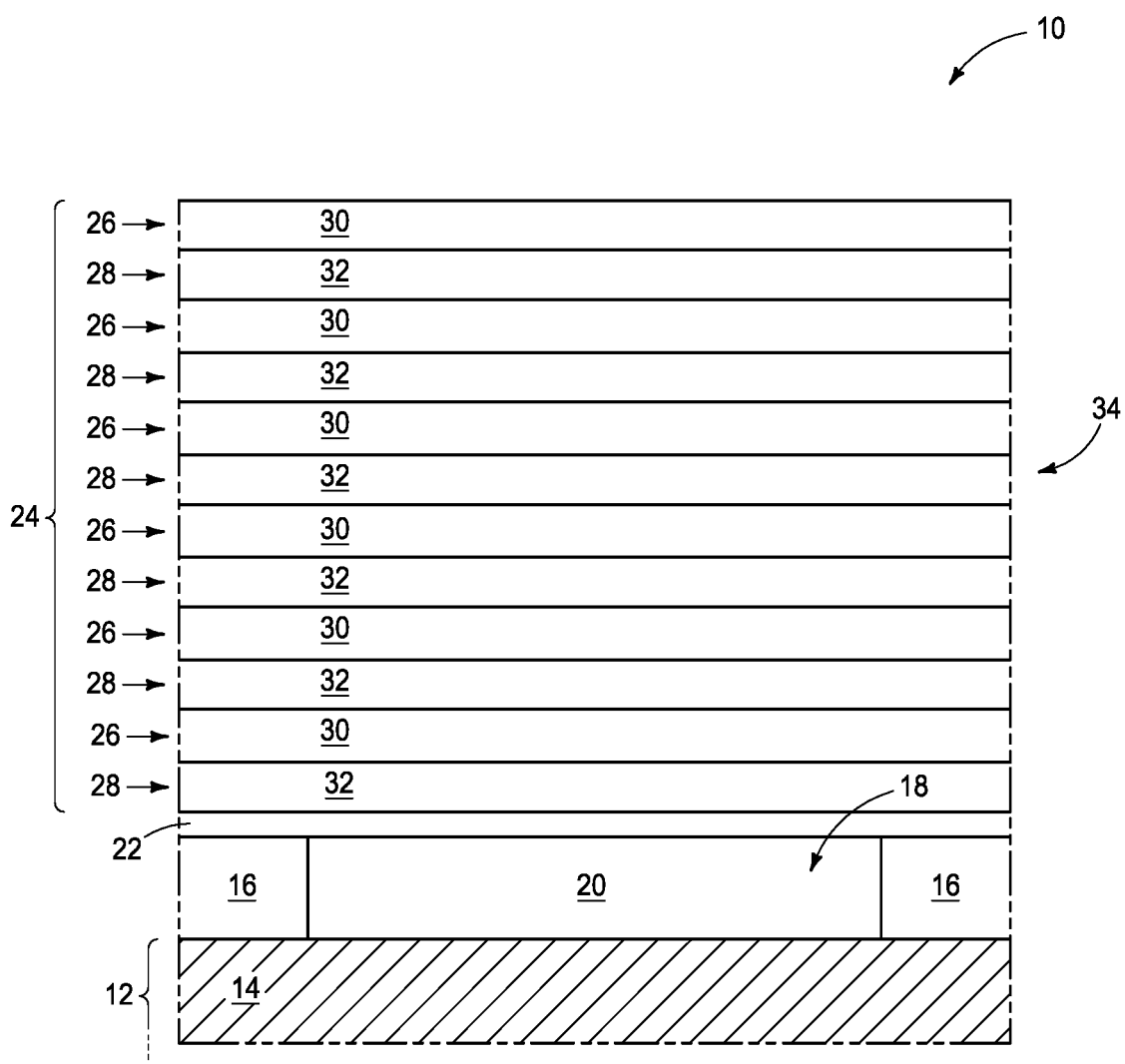
FIGS. 5-21 are diagrammatic cross-sectional side views of a region of an integrated assembly at example process stages of an example method for forming an example structure.

Referring to FIG. 5, an assembly 10 includes a conductive structure 12. The conductive structure 12 may be a source structure analogous to the source structures 216 described above in the Background section. The illustrated region comprises conductive material 14. The conductive material 14 may comprise any suitable electrically conductive composition(s), and in some embodiments may comprise conductively-doped semiconductor material. The conductively-doped semiconductor material may be conductively-doped silicon (e.g., n-type silicon). The conductively-doped semiconductor material of the source structure 12 may be over one or more additional conductive materials of the source structure 12 (e.g., one or more metal-containing materials; such as, for example, one or both of tungsten and tungsten silicide) in some embodiments. The additional conductive materials of the source structure 12 are not shown in the figures of this disclosure to simplify the drawings.

The source structure 12 may be supported by a semiconductor substrate (base). The semiconductor substrate is not shown in the figures of this disclosure to simplify the drawings. The semiconductor substrate may comprise any suitable semiconductor composition(s); and in some embodiments may comprise monocrystalline silicon.

An insulative material 16 is over the conductive material 14, and a sacrificial plug 18 extends through the insulative material 16.

The insulative material 16 may comprise any suitable composition(s), and in some embodiments may comprise, consist essentially of, or consist of silicon dioxide.

The sacrificial plug 18 comprises a sacrificial material 20. Such sacrificial material may comprise any suitable composition(s), and in some embodiments may comprise, consist essentially, or consist of tungsten.

An insulative material 22 extends across the materials 16 and 20. The insulative material 22 may comprise any suitable composition(s), and in some embodiments may comprise, consist essentially of, or consist of silicon dioxide.

A stack 24 of alternating first and second tiers (levels, layers) 26 and 28 is formed over the insulative material 22. The stack 24 may comprise any suitable number of alternating tiers 26 and 28. The tiers 26 ultimately become conductive levels of a memory arrangement. There may be any suitable number of tiers 26 to form the desired number of conductive levels. In some embodiments, the number of tiers 26 may be 8, 16, 32, 64, etc.

The first tiers 26 comprise a first material 30. Such first material may comprise any suitable composition(s), and in some embodiments may comprise, consist essentially of, or consist of silicon nitride.

The second tiers 28 comprise a second material 32. Such material may be an insulative material, and may comprise any suitable composition(s). In some embodiments, the material 32 may comprise, consist essentially of, or consist of silicon dioxide.

The tiers 26 and 28 may be of any suitable thicknesses; and may be the same thickness as one another, or may be different thicknesses relative to one another. In some embodiments, the tiers 26 and 28 may have vertical thicknesses within a range of from about 10 nanometers (nm) to about 400 nm.

In some embodiments, the stack 24 may be referred to as a first stack to distinguish it from an additional stack formed at a later process stage. The first stack 24 may be considered to be comprised by a first deck 34.

Figure 6:
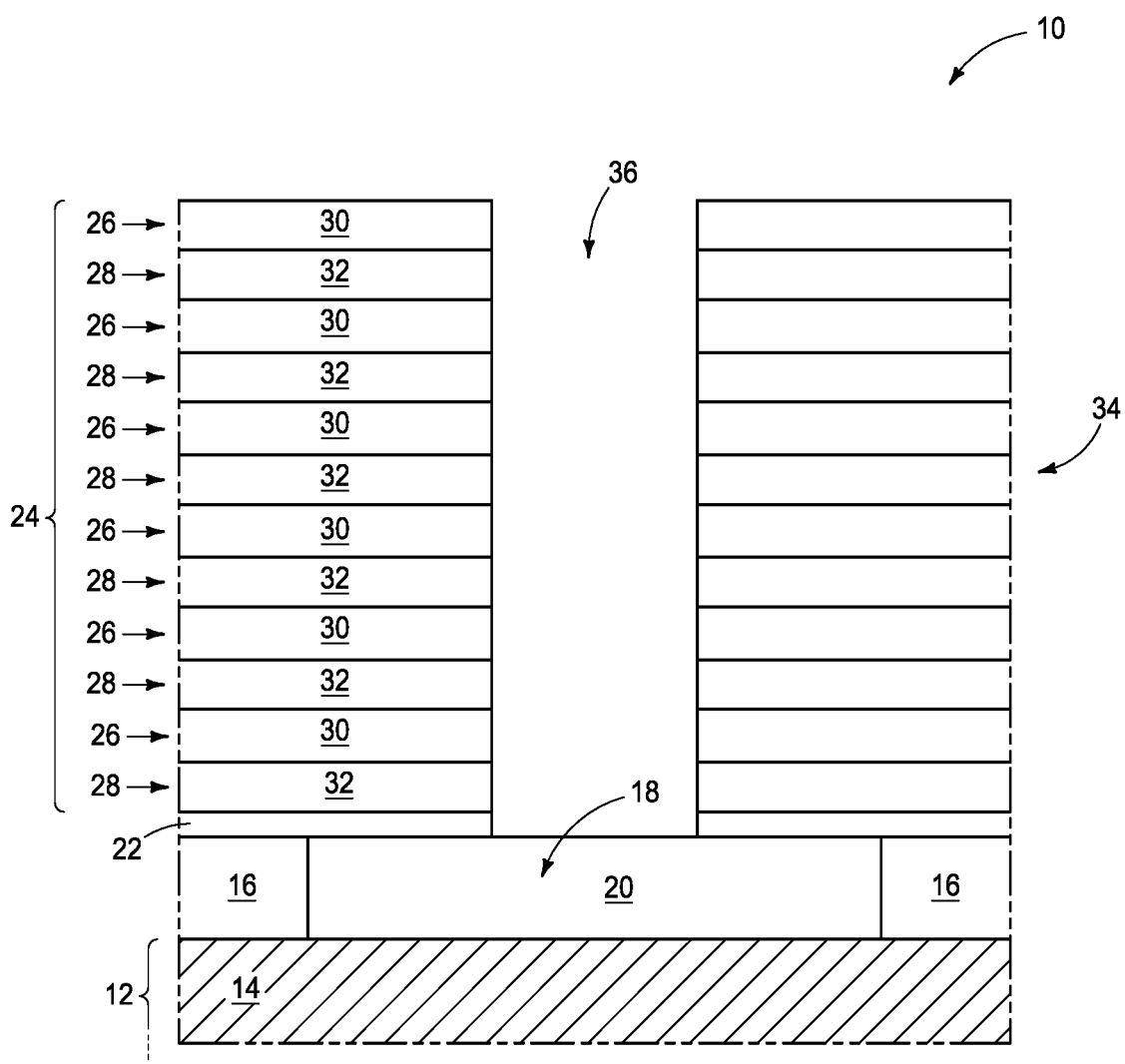

Referring to FIG. 6, an opening 36 is formed to extend through the stack 24 to an upper surface of the sacrificial material 20 of the plug 18.

Figure 7:
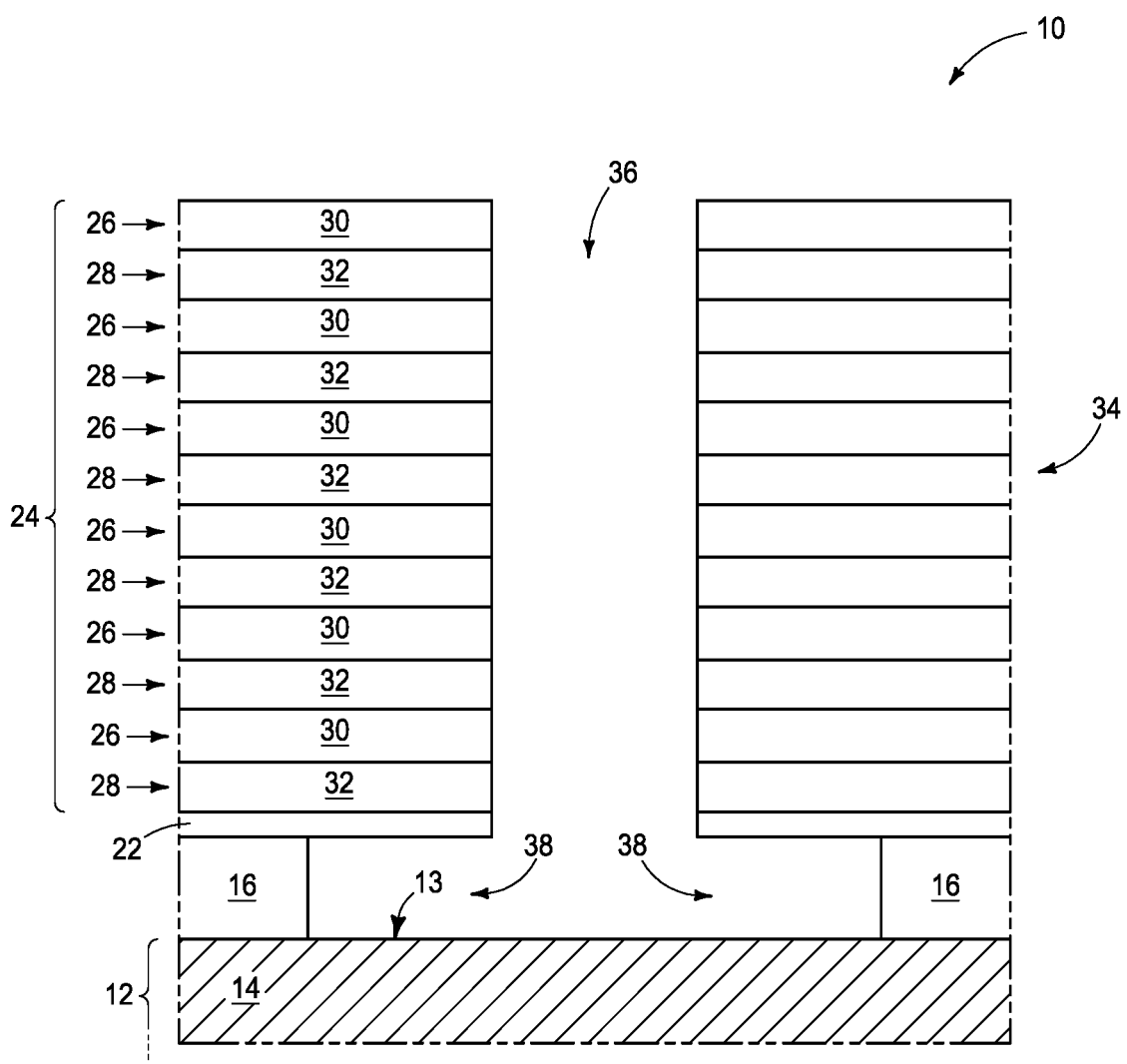

Referring to FIG. 7, the sacrificial material 20 (FIG. 6) is removed, and accordingly the opening 36 is extended to an upper surface 13 of the conductive structure 12. In the illustrated embodiment, the opening 36 includes recesses 38 that extend to under the stack 24, with such recesses being between the stack 24 and the upper surface 13 of the conductive structure 12.

In some embodiments, the opening 36 may be referred to as a first opening to distinguish it from an additional opening formed at a subsequent process stage.

Figure 8:
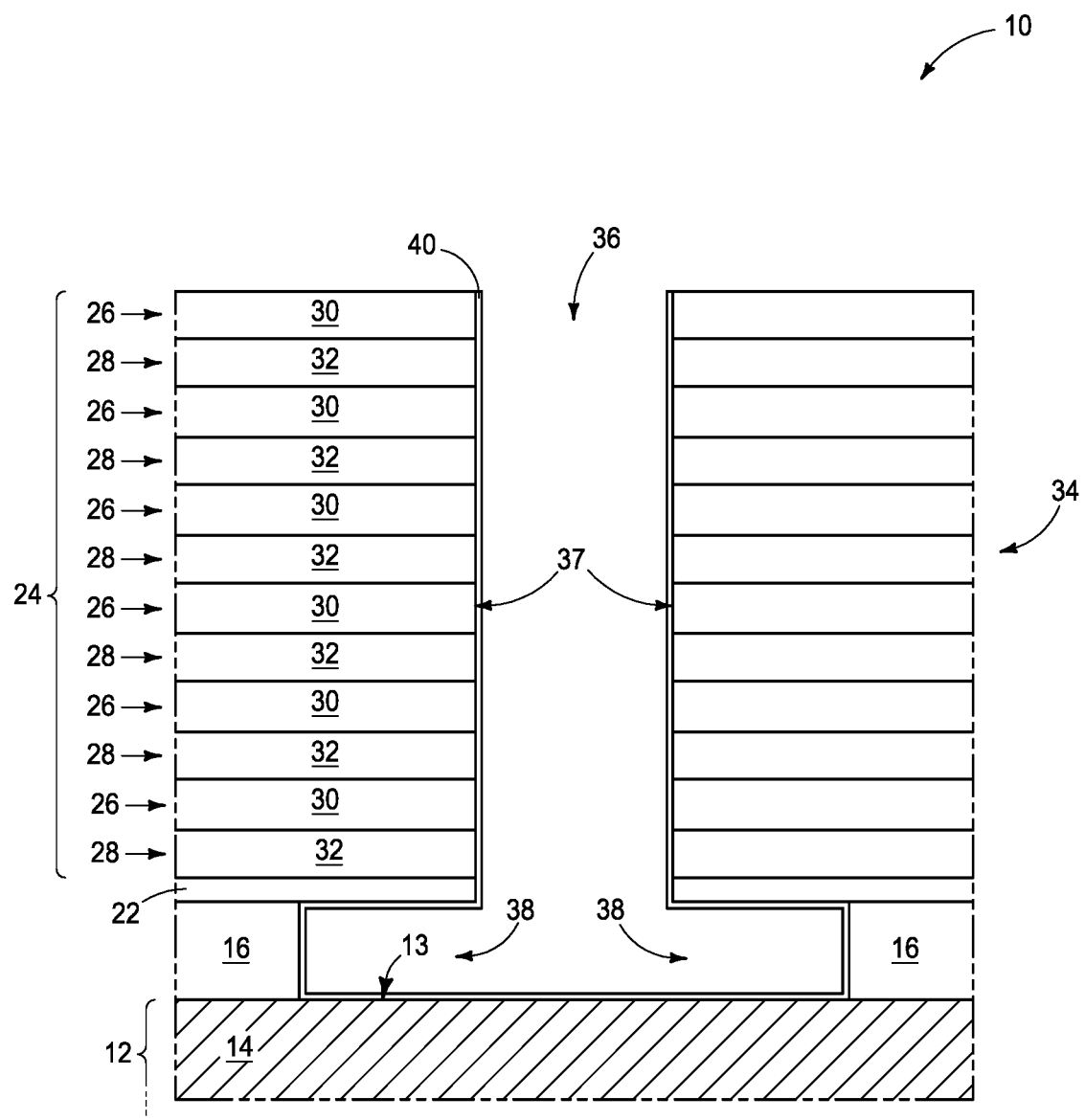

Referring to FIG. 8, a material 40 is formed to line a periphery of the first opening 36. The material 40 may be referred to as a liner material. In some embodiments, the liner material 40 may be referred to as a first liner material to distinguish it from an additional liner material formed at a subsequent process stage.

The liner material 40 may comprise any suitable composition(s); and in some embodiments may comprise, consist essentially of, or consist of a combination of silicon and nitrogen (i.e., may comprise SiN, where the chemical formula indicates primary constituents rather than a specific stoichiometry). In some embodiments, the liner material 40 may comprise, consist essentially of, or consist of stoichiometric silicon nitride (i.e., $Si_3N_4$).

The liner material 40 lines a periphery of the opening 36. Specifically, the liner material 40 is along the sidewalls 37 of the opening 36, and extends into the recesses 38 and along the upper surface 13 of the conductive structure 12.

The liner material 40 may be formed to any suitable thickness; and in some embodiments may be formed to a thickness within a range of from about 10 angstroms (Å) to about 60 Å.

Figure 9:
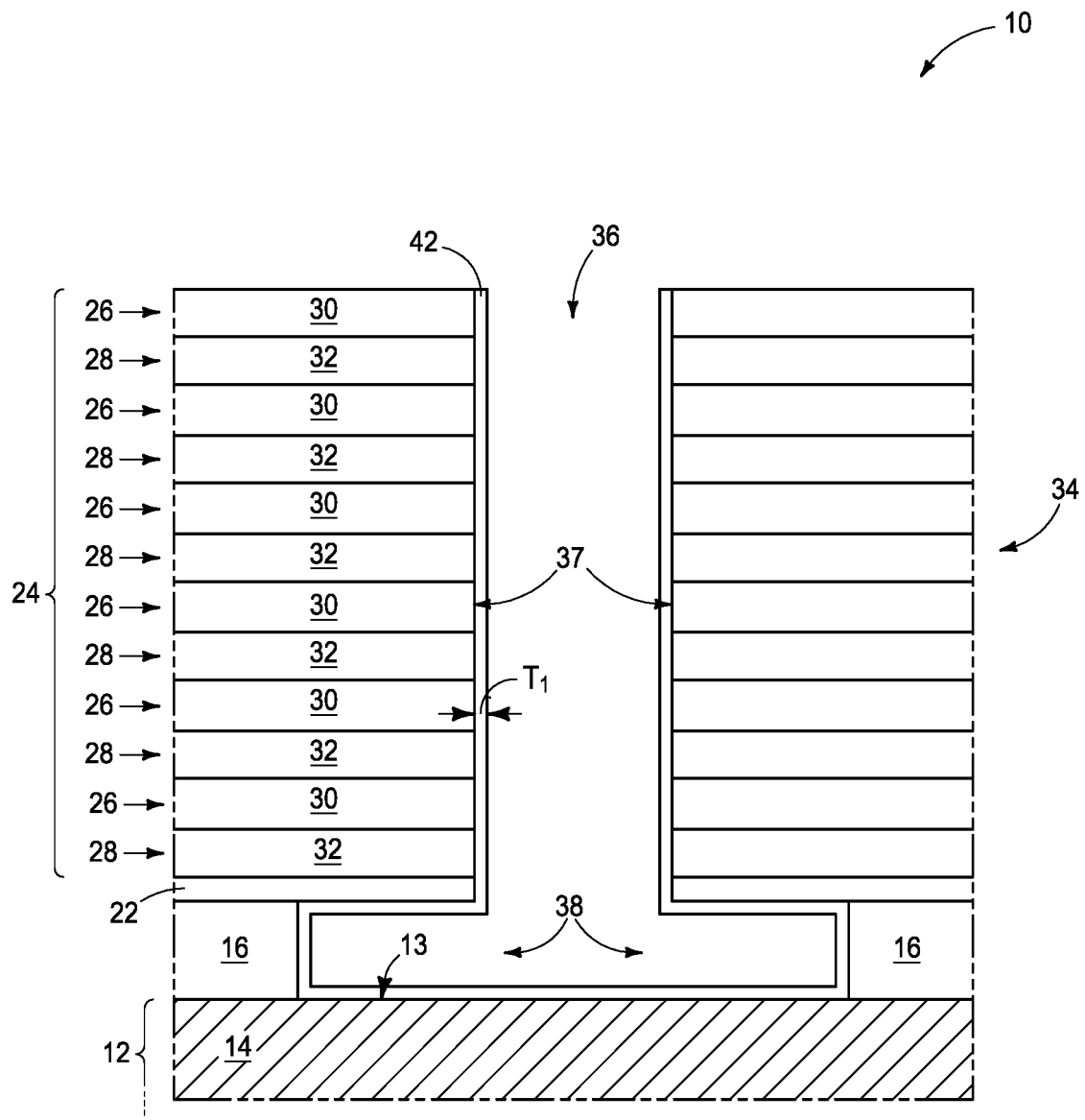

Referring to FIG. 9, the liner material 40 (FIG. 8) is chemically altered to convert such liner material into a charge-blocking material 42. In some embodiments, such chemical alteration may comprise oxidation of the liner material 40. For instance, in some embodiments the liner material 40 may comprise SiN (where the chemical formula indicates primary constituents rather than a specific stoichiometry), and the charge-blocking material 42 may comprise SiON (where the chemical formula indicates primary constituents rather than a specific stoichiometry) which is formed by oxidizing the SiN of the liner material.

The charge-blocking material 42 may comprise any suitable thickness; and in some embodiments may have a thickness within a range of from about 45 Å to about 60 Å. The thickness of the charge-blocking material 42 along the sidewalls 37 may be referred to as a lateral thickness $T_1$ of the charge-blocking material.

In some embodiments, the charge-blocking material 42 may be referred to as a first charge-blocking material to distinguish it from an additional charge-blocking material formed at a subsequent process stage.

Figure 10:
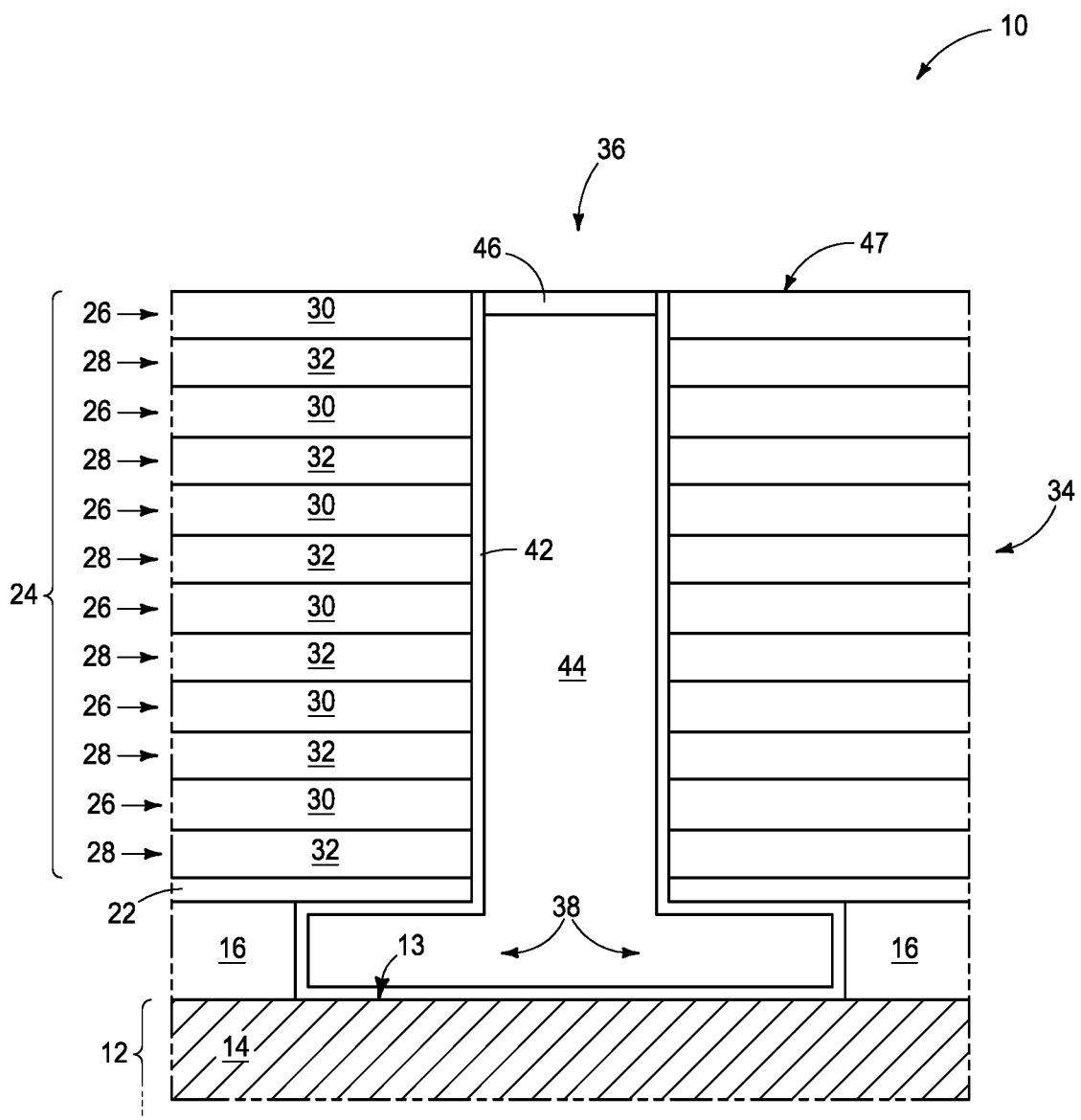

Referring to FIG. 10, sacrificial materials 44 and 46 are formed within the opening 36. The sacrificial materials 44 and 46 are along the charge-blocking material 42, and in the shown embodiment are directly against such charge-blocking material.

A problem which may occur with conventional fabrication processes is that problematic stress imbalances may be present within a semiconductor assembly. For instance, high-k materials (e.g., $AlO_x$; where x is a number) may be utilized as etch-stopping materials in some conventional assemblies. The high-k materials may have stress mismatch (stress imbalance) relative to other materials. The stress mismatch may undesirably lead to bending and/or other perturbations of a semiconductor assembly during thermal processing. In some embodiments, the bulk sacrificial material 44 is a material having tensile stress associated therewith (i.e., is a tensile-stress-material). Example tensile-stress-materials are aluminum oxide ($Al_2O_3$) and tungsten (W).

The tensile-stress-material within the opening 36 may balance stress mismatch to alleviate, or even eliminate, the undesired bending and/or other perturbations otherwise induced by thermal processing. In some embodiments, the $AlO_x$ (tensile) combined with a preceding SiON liner (compressive) may provide improved stress balancing.

It is to be understood that the illustrated opening 36 having the tensile-stress-material 44 therein is representative of a large number of openings that may be formed within the assembly 10, and that the combined influences from the tensile-stress-materials within such openings may balance stress mismatch.

In some embodiments, the bulk sacrificial material 44 may comprise, consist essentially of, or consist of AlO; where the chemical formula indicates primary constituents rather than a specific stoichiometry. In some embodiments, the bulk sacrificial material 44 may comprise, consist essentially of, or consist of stoichiometric aluminum oxide ($Al_2O_3$). In some embodiments, the aluminum oxide may be an example of a high-k oxide having suitable tensile stress properties. Other high-k oxides (e.g., hafnium oxide, zirconium oxide, etc.) may also provide desired tensile stress properties. Accordingly, in some embodiments, the bulk material may comprise, consist essentially of, or consist of one or more high-k oxides (e.g., one or more of aluminum oxide, hafnium oxide and zirconium oxide). The term "high-k oxide" means an oxide having a dielectric constant greater than the dielectric constant associated with silicon dioxide (i.e., greater than about 3.9).

The tensile-stress-material 44 may, for example, fill at least about 50% of the volume of the opening 36, at least about 90% of the volume of the opening 36, or at least about 100% of the volume of the opening 36.

In the shown embodiment, a layer of capping material 46 is provided over the bulk material 44. The capping material 46 may comprise any suitable composition(s); and in some embodiments may comprise a silicate glass. For instance, the capping material 46 may comprise, consist essentially of, or consist of one or more of borophosphosilicate glass, phosphosilicate glass and fluorosilicate glass.

The capping material may be utilized to protect an upper surface of the bulk material 44 during subsequent etching. For instance, in some embodiments the bulk material 44 may comprise aluminum oxide, and the capping material 46 may be utilized to prevent such aluminum oxide from being exposed to a subsequent etch which may undesirably sputter the aluminum oxide.

A planarized surface 47 extends across the stack 24 and the material 46. The planarized surface 47 may be formed with any suitable processing; such as, for example, chemical-mechanical polishing (CMP).

Figure 11:
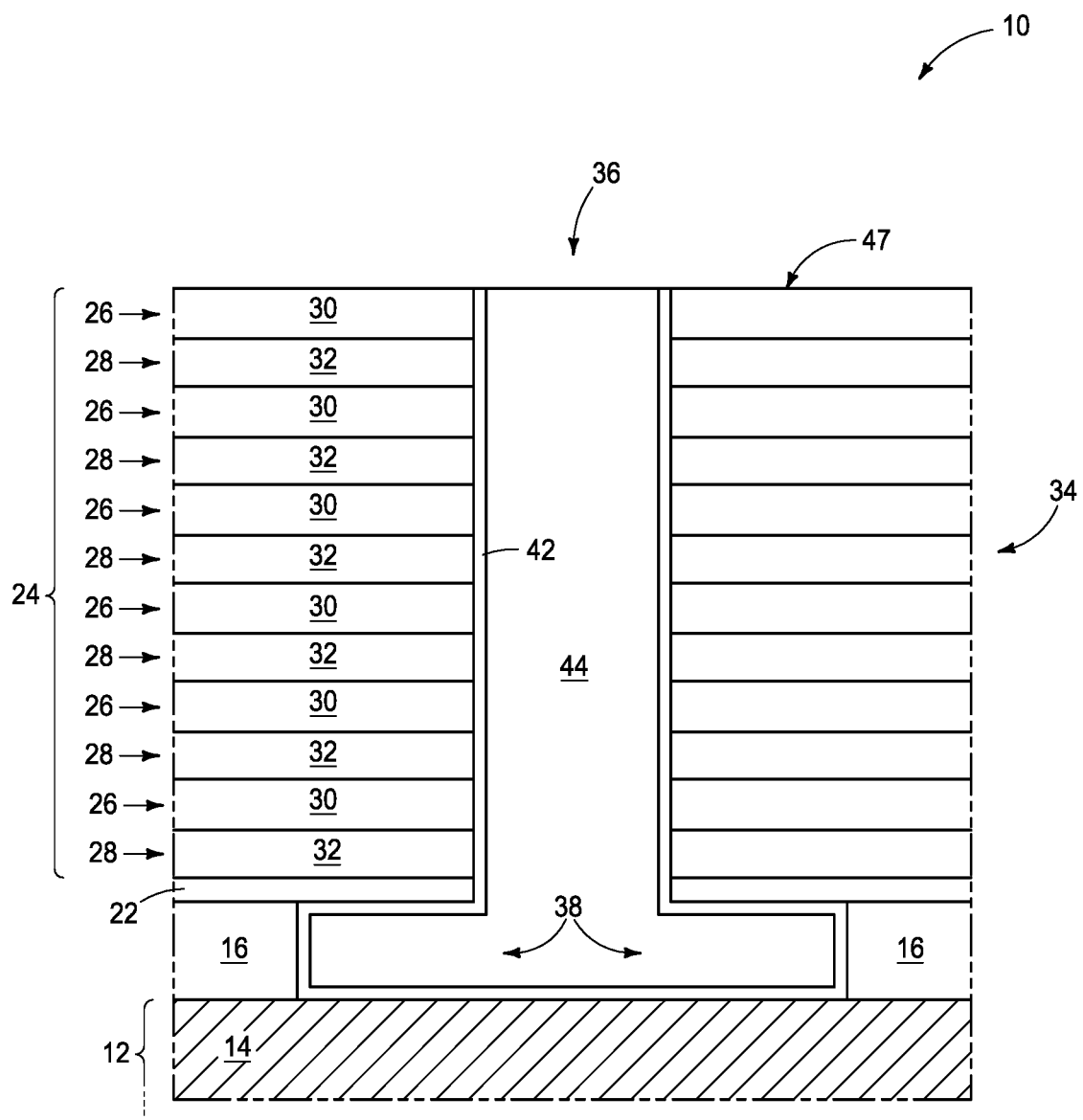

In some embodiments, the capping material 46 may be omitted. For instance, FIG. 11 shows an embodiment similar to that of FIG. 10, but in which the capping material 46 is not utilized. The bulk material 44 (i.e., the tensile-stress-material) thus fills 100% of the volume of the opening 36. The material 44 of the embodiment of FIG. 11 may comprise, consist essentially of, or consist of any suitable composition(s); and in some embodiments may comprise aluminum oxide or tungsten.

Figure 12:
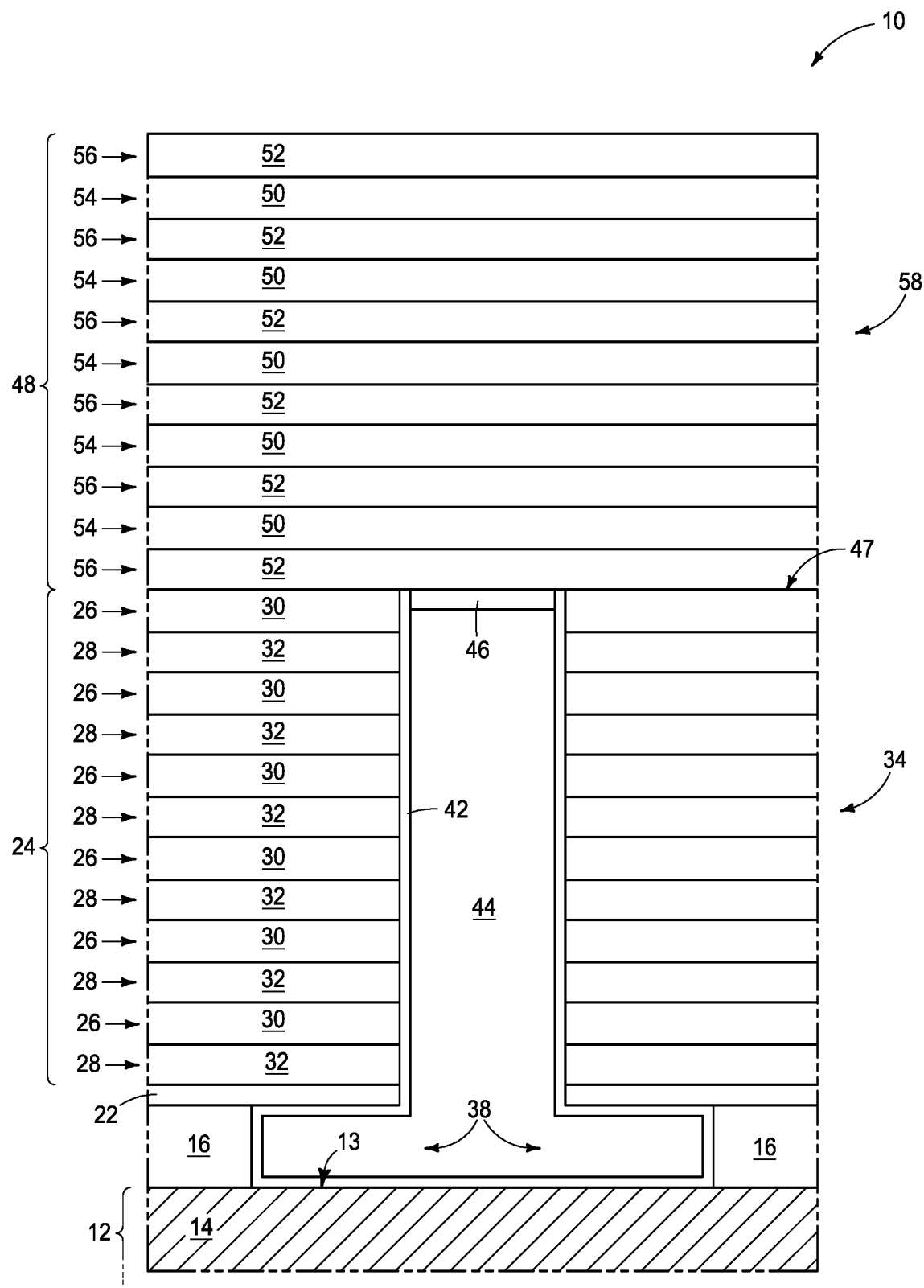

FIG. 12 shows the assembly 10 at a process stage following that of FIG. 10 (and accordingly the capping material 46 is over the bulk material 44). Although the assembly is shown at a processing stage following that of FIG. 10, in other embodiments an analogous process stage may follow the process stage of FIG. 11 (and accordingly the capping material 46 may be omitted).

A second stack 48 is formed over the first stack 24. The second stack 48 comprises alternating third and fourth tiers (levels, layers) 54 and 56. The stack 48 may comprise any suitable number of alternating tiers 54 and 56. The tiers 54 ultimately become conductive levels of a memory arrangement. There may be any suitable number of tiers 54 to form the desired number of conductive levels. In some embodiments, the number of tiers 54 may be 8, 16, 32, 64, etc.

The third tiers 54 comprise a third material 50. Such third material may comprise any suitable composition(s), and in some embodiments may comprise, consist essentially of, or consist of silicon nitride. The third material 50 may comprise a same composition as the first material 30 of the first tiers 26.

The fourth tiers 56 comprise a fourth material 52. Such material may be an insulative material, and may comprise any suitable composition(s). In some embodiments, the material 52 may comprise, consist essentially of, or consist of silicon dioxide. The fourth material 52 may comprise a same composition as the second material 32 of the second tiers 28.

The tiers 54 and 56 may be of any suitable thicknesses; and may be the same thickness as one another, or different thicknesses relative to one another. In some embodiments, the tiers 54 and 56 may have vertical thicknesses within a range of from about 10 nm to about 400 nm.

In some embodiments, the stack 48 may be referred to as a second stack to distinguish it from the first stack 24. The second stack 48 may be considered to be comprised by a second deck 58.

Although the second stack 48 is shown to be formed directly over the first stack 24, it is to be understood that in other embodiments there may be one or more inter-deck materials provided between the first and second stacks.

Figure 13:
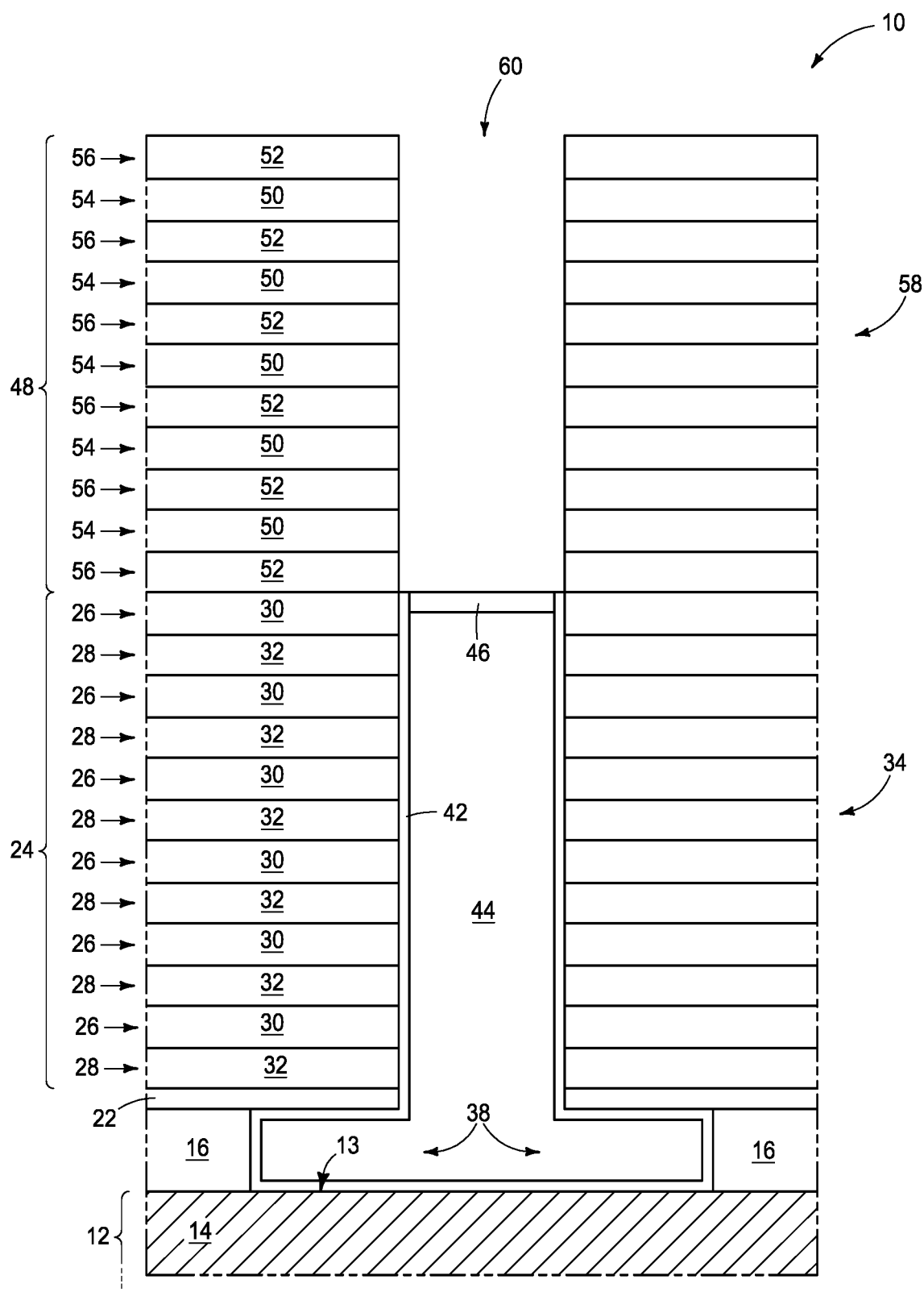

Referring to FIG. 13, an opening 60 is formed to extend through the stack 48 to an upper surface of the sacrificial material 46.

In some embodiments, the opening 60 may be referred to as a second opening to distinguish it from the first opening 36 described above with reference to FIG. 6.

Figure 14:
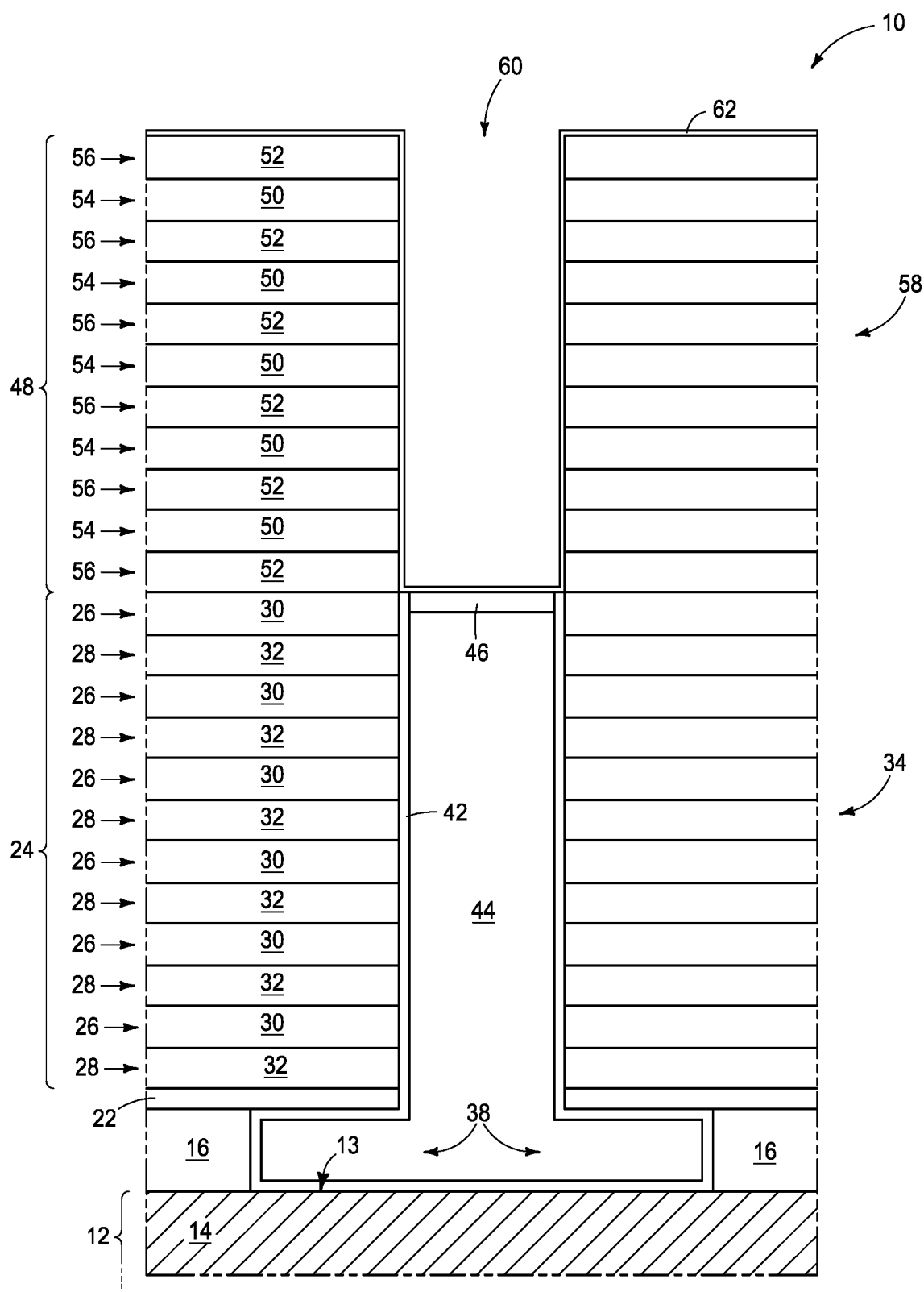

Referring to FIG. 14, a second liner material 62 is formed over the assembly 10 and within the opening 60.

The second liner material 62 may comprise any suitable composition(s); and in some embodiments may comprise, consist essentially of, or consist of a combination of silicon and nitrogen (i.e., may comprise SiN, where the chemical formula indicates primary constituents rather than a specific stoichiometry). In some embodiments, the liner material 62 may comprise, consist essentially of, or consist of stoichiometric silicon nitride (i.e., $Si_3N_4$).

The second liner material 62 may be formed to any suitable thickness; and in some embodiments may be formed to a thickness within a range of from about 10 Å to about 60 Å.

The second liner material 62 may or may not comprise a same composition as the first liner material 40 described above with reference to FIG. 8. For instance, in some embodiments the first and second liner materials 40 and 62 may both comprise, consist essentially of, or consist of stoichiometric silicon nitride ($Si_3N_4$); and accordingly may comprise the same composition as one another. In such embodiments, the liner material 62 may be formed to a same thickness as the liner material 40, or may be formed to a different thickness than the liner material 40. In other example embodiments, the first and second liner materials 40 and 62 may both comprise a combination of silicon and nitrogen, but the stoichiometry may be different in the liner material 40 relative to the liner material 62. Accordingly, even though the liner materials 40 and 62 both comprise the same constituents (silicon and nitrogen), the liner materials 40 and 62 are not chemically identical to one another. In such embodiments, the liner materials 40 and 62 may or may not be formed to a same thickness as one another.

Figure 15:
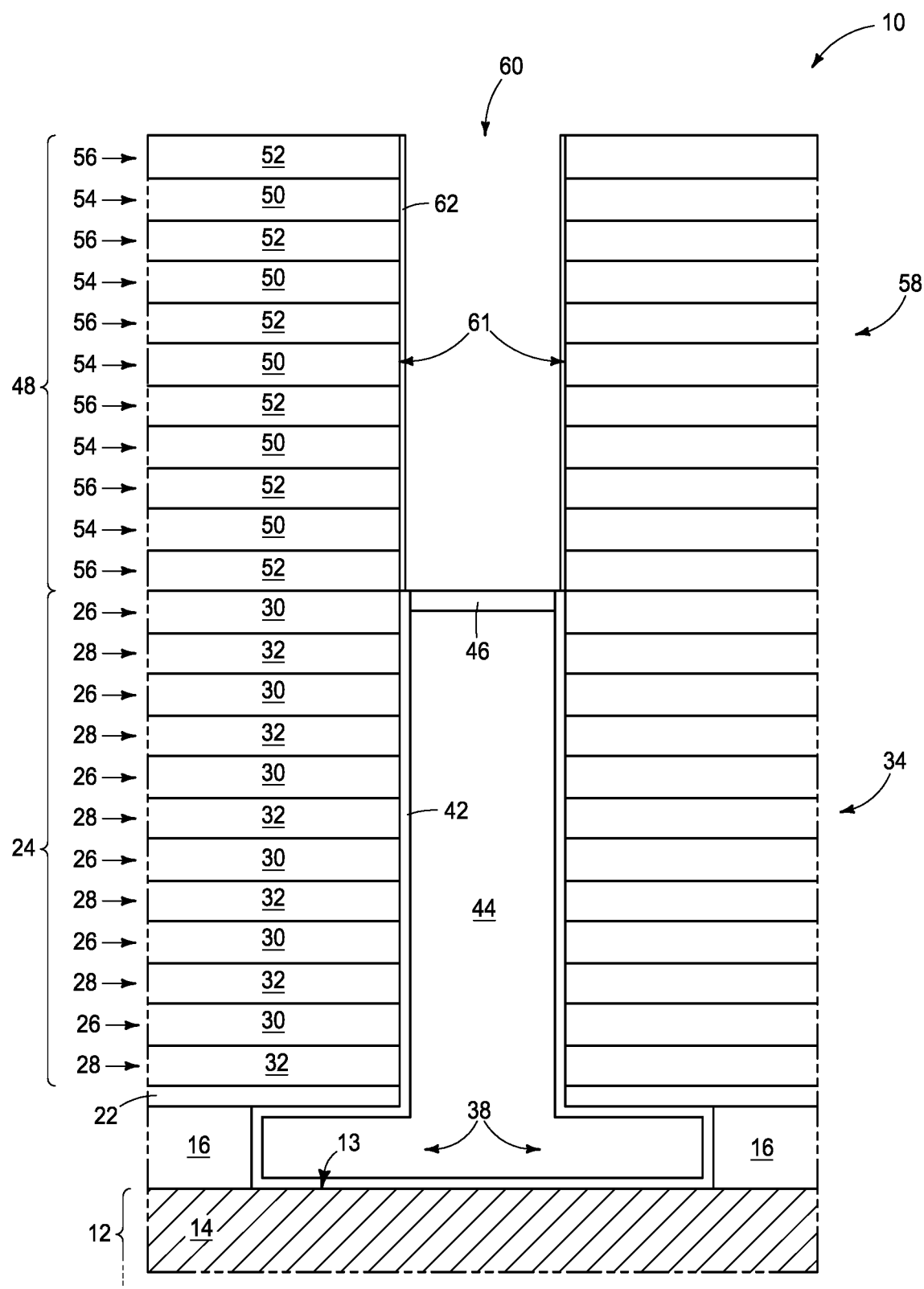

Referring to FIG. 15, the liner material 62 is anisotropically etched to remove the liner material from over the top of stack 48 and from along the bottom of the opening 60, while leaving the liner material along sidewalls 61 of the opening 60. The liner material 62 may be considered to line the sidewalls 61 at the processing stage of FIG. 15.

Figure 16:
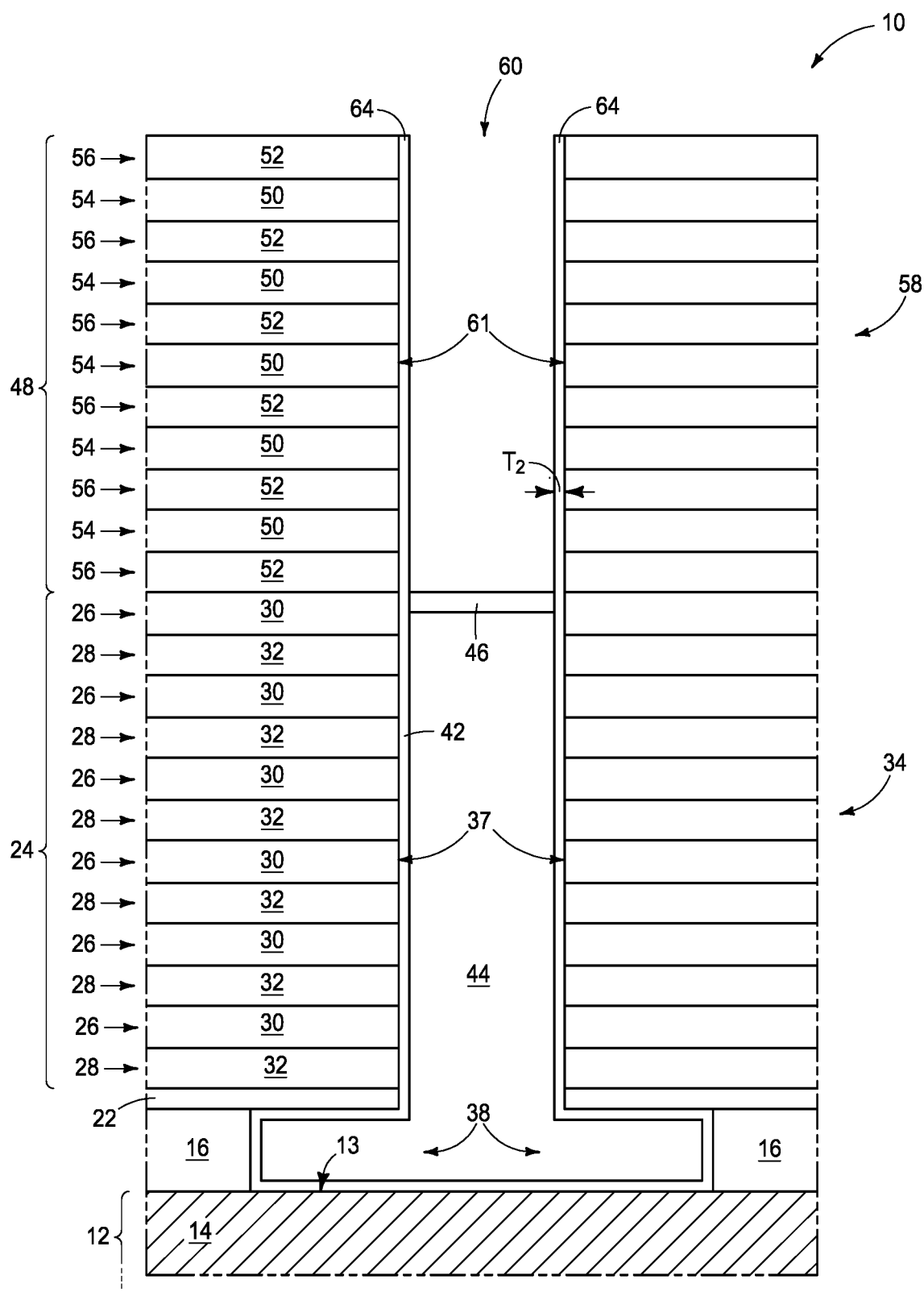

Referring to FIG. 16, the second liner material 62 (FIG. 15) is chemically altered to convert such liner material into a second charge-blocking material 64. In some embodiments, such chemical alteration may comprise oxidation of the second liner material 62. For instance, in some embodiments the second liner material 62 may comprise SiN (where the chemical formula indicates primary constituents rather than a specific stoichiometry), and the charge-blocking material 64 may comprise SiON (where the chemical formula indicates primary constituents rather than a specific stoichiometry) which is formed by oxidizing the SiN of the liner material 62.

The charge-blocking material 64 may comprise any suitable thickness; and in some embodiments may have a thickness within a range of from about 45 Å to about 60 Å. The thickness of the charge-blocking material 64 along the sidewalls 61 may be referred to as a lateral thickness $T_2$ of the second charge-blocking material 64. The thickness $T_2$ may be referred to as a second thickness to distinguish it from the first thickness $T_1$ of the first charge-blocking material 42 described above with reference to FIG. 9.

The second charge-blocking material 64 may or may not comprise a same composition as the first charge-blocking material 42 described above with reference to FIG. 9. For instance, in some embodiments the first and second charge-blocking materials 42 and 64 may both comprise, consist essentially of, or consist of a combination of silicon, oxygen and nitrogen (i.e., SiON, where the chemical formula indicates primary constituents rather than a specific stoichiometry). The charge-blocking materials 42 and 64 may both comprise a same stoichiometry of the SiON; and accordingly may comprise the same composition as one another. Alternatively, the charge-blocking materials 42 and 64 may comprise different stoichiometries of the SiON relative to one another.

The first and second lateral thicknesses $T_1$ (FIG. 9) and $T_2$ (FIG. 16) of the first and second charge-blocking materials 42 and 64 may or may not be the same as one another. If the composition of the charge-blocking material 64 differs from that of the charge-blocking material 42, and/or if the thickness of the charge-blocking material 64 differs from that of the charge-blocking material 42, the materials 42 and 64 will join at a location which can be detected with appropriate instrumentation and methodology. In such embodiments, the interface between the materials 42 and 64 may be referred to as a detectable location (or as a detectable interface). In the illustrated embodiment, the charge-blocking materials 42 and 64 are a same composition as one another, and a same thickness as one another, and accordingly merge into a single charge-blocking composition of substantially uniform thickness extending along the sidewalls 37 and 61 of the stacks 24 and 48, respectively. The term "substantially uniform thickness" means a uniform thickness to within reasonable tolerances of fabrication and measurement.

Figure 17:
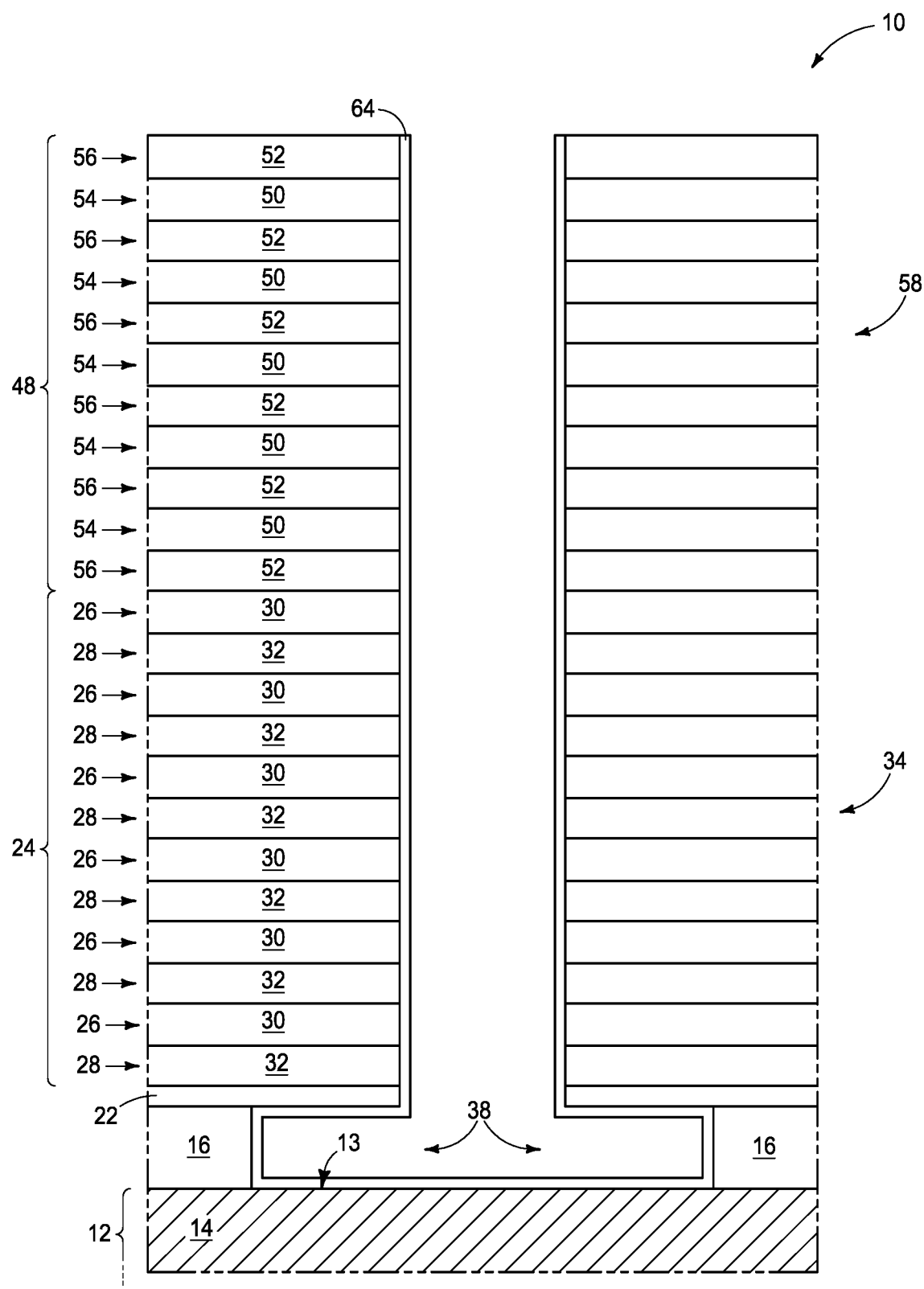

Referring to FIG. 17, the sacrificial materials 44 and 46 (FIG. 16) are removed, and accordingly the opening 60 is extended into the recesses 38. The charge-blocking material is simply labeled as material 64 in FIG. 17, rather than distinguishing between the materials 42 and 64, since the materials 42 and 64 are a same composition and thickness as one another in the illustrated embodiment.

Figure 18:
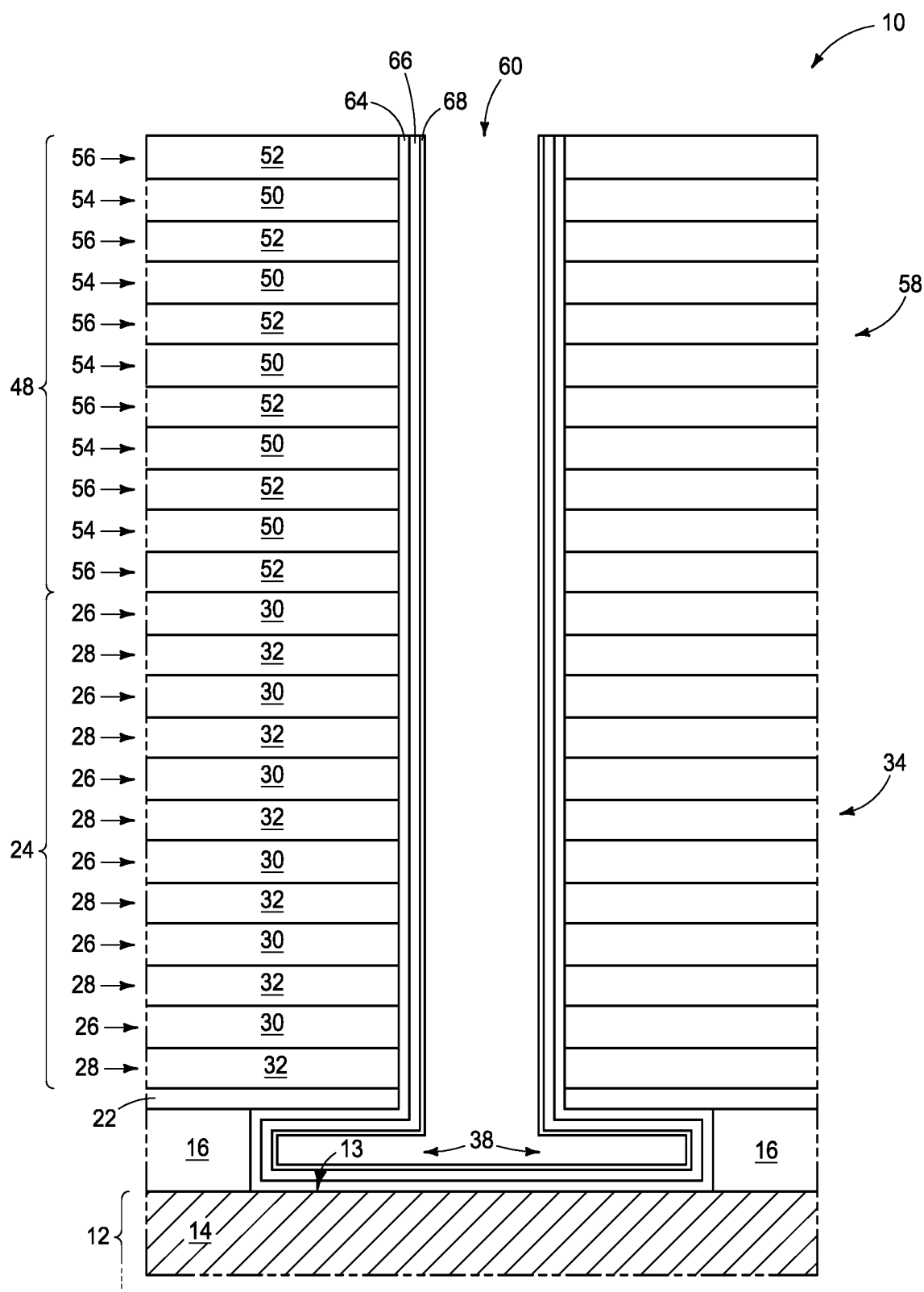

Referring to FIG. 18, charge-storage material 66 is formed along the charge-blocking material 64, and dielectric material (gate-dielectric material, tunneling material) 68 is formed along the charge-storage material.

The charge-storage material 66 may comprise any suitable composition(s); and in some embodiments may comprise charge-trapping material; such as, for example, one or more of silicon nitride, silicon oxynitride, conductive nanodots, etc.

The dielectric material 68 may comprise any suitable composition(s); and in some embodiments may comprise one or more of silicon dioxide, silicon nitride, aluminum oxide, hafnium oxide, zirconium oxide, etc. For instance, in some embodiments the material 68 may comprise ONO (i.e., a laminate having a layer of silicon nitride sandwiched between layers of silicon dioxide).

Figure 19:
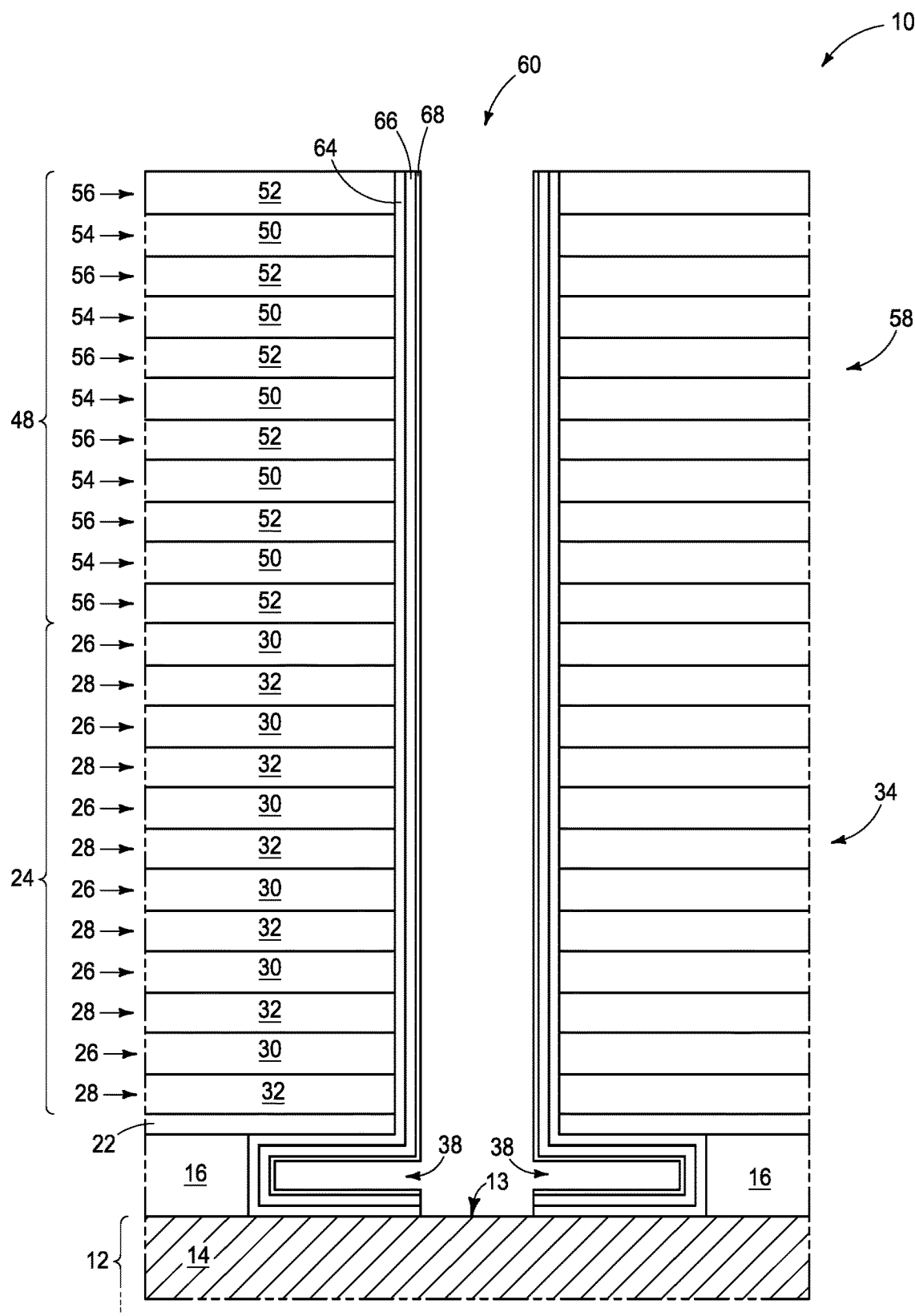

Referring to FIG. 19, the opening 60 is extended through the materials 64, 66 and 68 at the bottom of the opening. Such may be accomplished with one or more suitable anisotropic etches, and exposes the upper surface 13 of the conductive structure 12. In some embodiments, the upper surface 13 comprises conductively-doped silicon.

The etch utilized to extend the opening 60 through the materials 64, 66 and 68 may be referred to as a punch-through etch.

Figure 20:
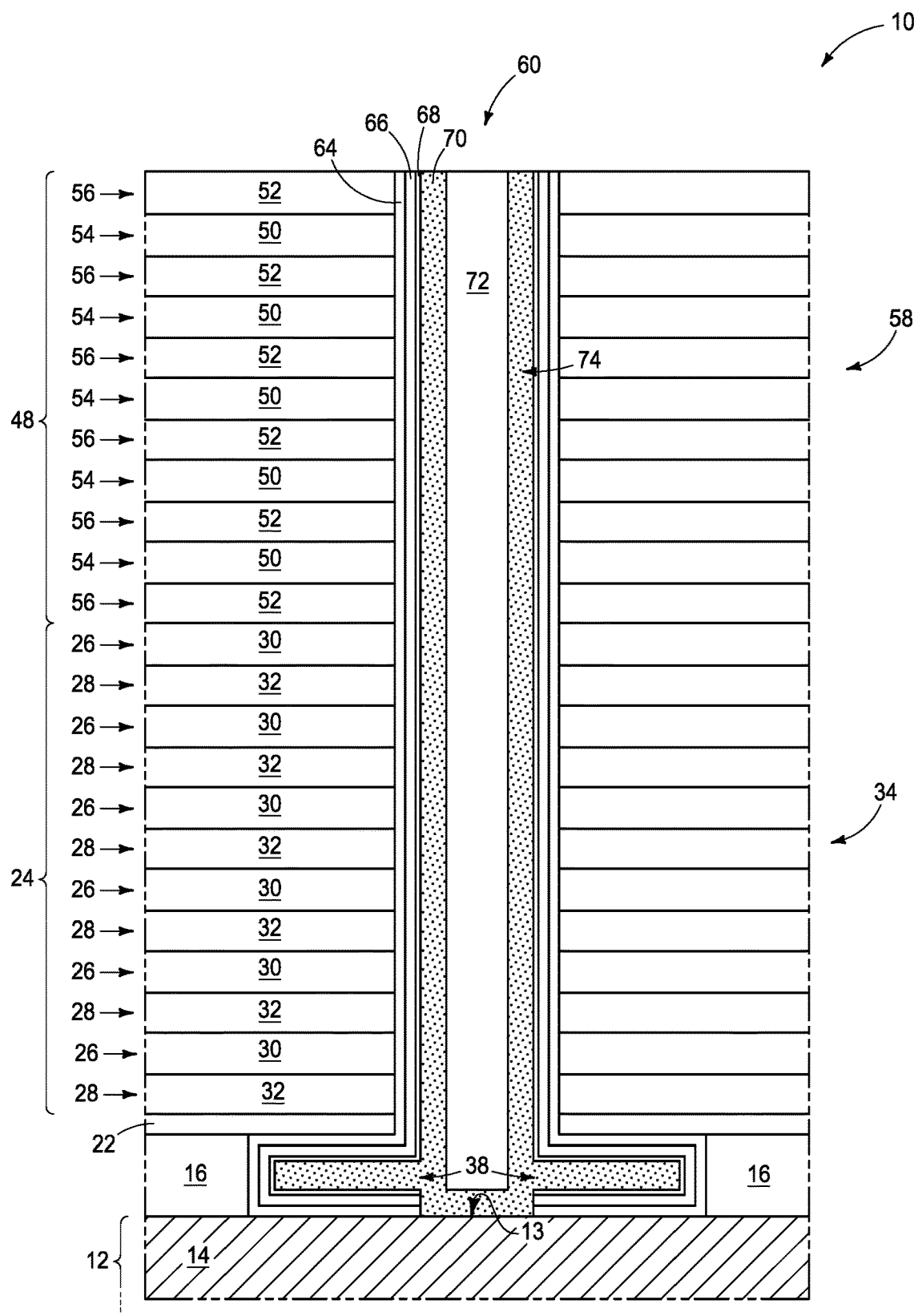

Referring to FIG. 20, channel material 70 is formed within the opening 60 and adjacent to the dielectric material 68. The channel material 70 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the channel material 70 may comprise, consist essentially of, or consist of appropriately-doped silicon. The channel material is electrically coupled with the conductive structure 12, and in the shown embodiment is directly against the upper surface 13 of the conductive material 14.

The channel material 70 is configured as a pillar 74 extending through the stacks 24 and 48. In the illustrated embodiment such pillar is hollow, and dielectric material 72 is formed within the hollow in the pillar 74. In other embodiments the channel material 70 may be configured as a solid pillar, rather than the illustrated hollow configuration.

The dielectric material 72 may comprise any suitable composition(s); and in some embodiments may comprise, consist essentially of, or consist of silicon dioxide.

In the illustrated embodiment of FIG. 20, the charge-blocking material 64, charge-storage material 66, gate-dielectric material (tunneling material) 68 and channel material 70 all extend within the recesses 38. Accordingly, portions of the materials 64, 66, 68 and 70 are disposed under the stack 24, and are directly between the stack 24 and the upper surface 13 of the conductive structure 12.

Figure 21:
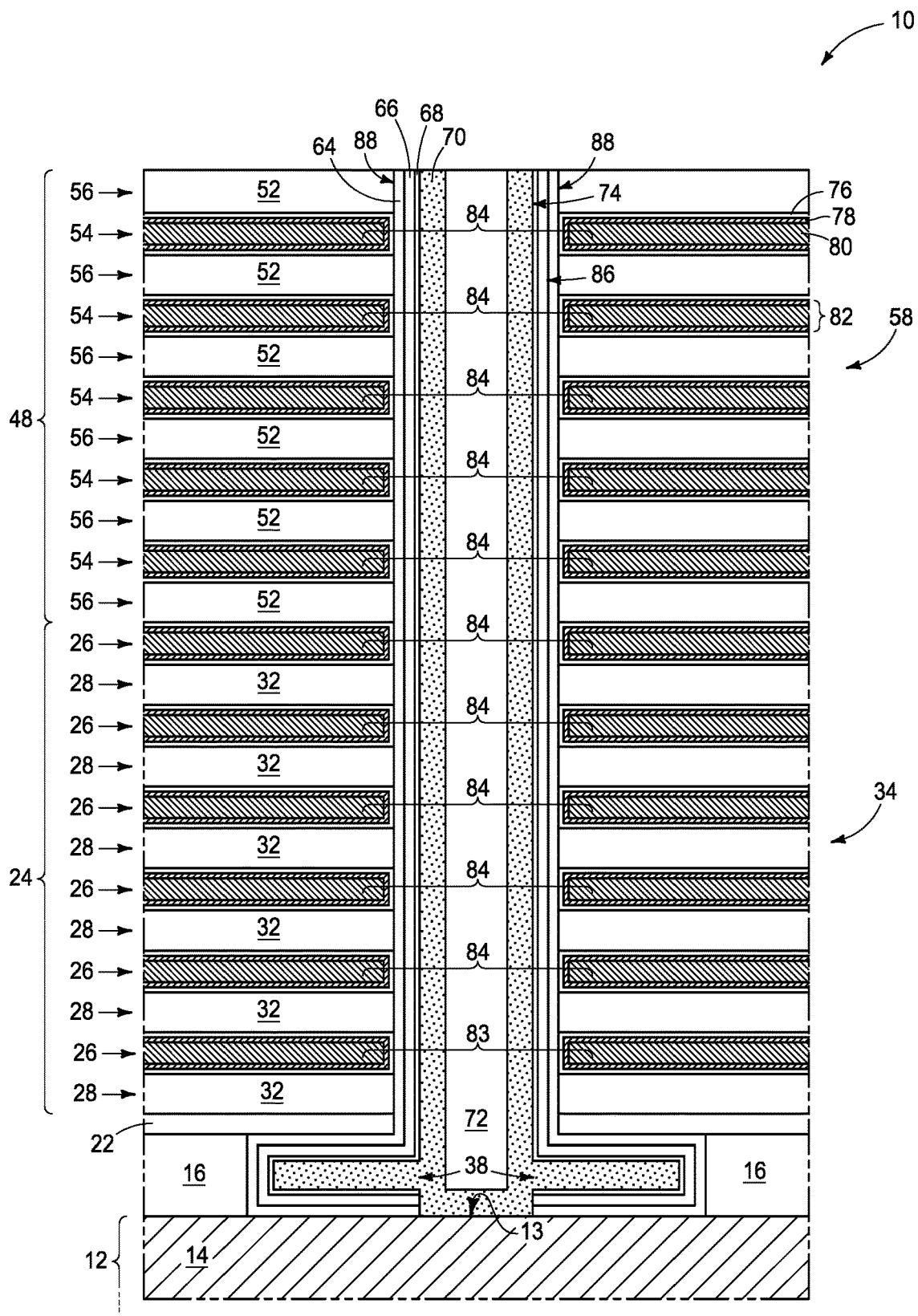

Referring to FIG. 21, the materials 30 and 50 (FIG. 20) of the first and third tiers 26 and 54 are replaced with materials 76, 78 and 80.

The material 76 may be a dielectric-barrier material; and may, for example, comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9).

The material 78 is a conductive material and may comprise a metal-containing composition (e.g., metal nitride, metal carbide, metal silicide, etc.). In some embodiments, the conductive material 78 may comprise titanium nitride.

The material 80 is a conductive material and may comprise metal. In some embodiments, the conductive material 80 may comprise, consist essentially of, or consist of, one or more of tungsten, tantalum, titanium, cobalt, molybdenum, nickel, ruthenium, etc.

In some embodiments, the conductive material 80 may be considered to be a conductive core material, and the conductive material 78 may be considered to be a conductive liner material along an outer peripheral surface of the core material. The liner material 78 comprises a different composition than the core material 80, and may or may not comprise a same metal as the core material.

In some embodiments, the conductive materials 78 and 80 may be considered together to be configured as conductive structures 82.

The alternating levels 26 and 28 of the first stack 24 may be referred to as first conductive levels and first insulative levels, respectively; and the alternating levels 54 and 56 of the stack 48 may be referred to as second conductive levels and second insulative levels, respectively.

The assembly 10 of FIG. 21 may be considered to be a memory device which comprises vertically-stacked memory cells 84. Each of the memory cells comprises segments of the conductive structures 82 of the conductive levels (26 and 54), and segments of the channel material 70. The portions of the conductive structures 82 within the memory cells 84 may be considered to be control gate regions of the memory cells. The portions of the conductive structures 82 which are not within the memory cells may be referred to as routing regions, or as wordline regions.

In some embodiments, the memory cells 84 within the first deck 34 may be considered to be arranged in first tiers (i.e., first conductive tiers) 26 which are disposed one atop another, and which are vertically spaced from one another by intervening insulative tiers 28. The memory cells 84 within the second deck 58 may be considered to be arranged in third tiers (i.e., second conductive levels) 54 which are disposed one atop another, and which are vertically spaced from one another by intervening insulative tiers 56.

The channel material pillar 74 may be considered to be part of a larger pillar 86 which includes the charge-storage material 66, dielectric material 68, channel material 70 and the dielectric material 72.

The charge-blocking material 64 may be considered to be configured as a charge-blocking structure 88 which extends through the stacks 24 and 48.

The pillar 86 passes through the first and second decks 34 and 58, and is adjacent to the charge-blocking structure 88.

The memory cells 84 along the pillar 86 may correspond to a vertical string of memory cells suitable for utilization in NAND memory of the types described above with reference to FIGS. 1-4.

A bottommost vertically-stacked structure is indicated to be an SGS-device 83. The SGS-device may be configured similarly to the memory cells 84 (as shown) or may be configured differently from the memory cells. Although only one of the conductive levels 26 is shown to comprise an SGS-device, in other embodiments multiple levels may comprise SGS-devices. Such SGS-devices may be ganged together.

There may be additional structures and devices over the illustrated region of the pillar 86 (e.g., an SGD-device) at the process stage of FIG. 21, or such additional structures and devices may be formed at subsequent process stages. Structures and devices that may be present over the illustrated region of pillar 86 are not shown in FIG. 21 to simplify the drawing.

The pillar 86 may be one of a large number of substantially identical pillars extending through the decks 34 and 58 of the memory device 10, with each of such pillars having a plurality of memory cells 84 associated therewith. Accordingly, the memory device 10 may comprise hundred, thousands, millions, hundreds of millions, etc., of the memory cells 84. The pillars are referred to as being "substantially identical" to one another to indicate that the pillars are identical to within reasonable tolerances of fabrication and measurement.

Figure 22:
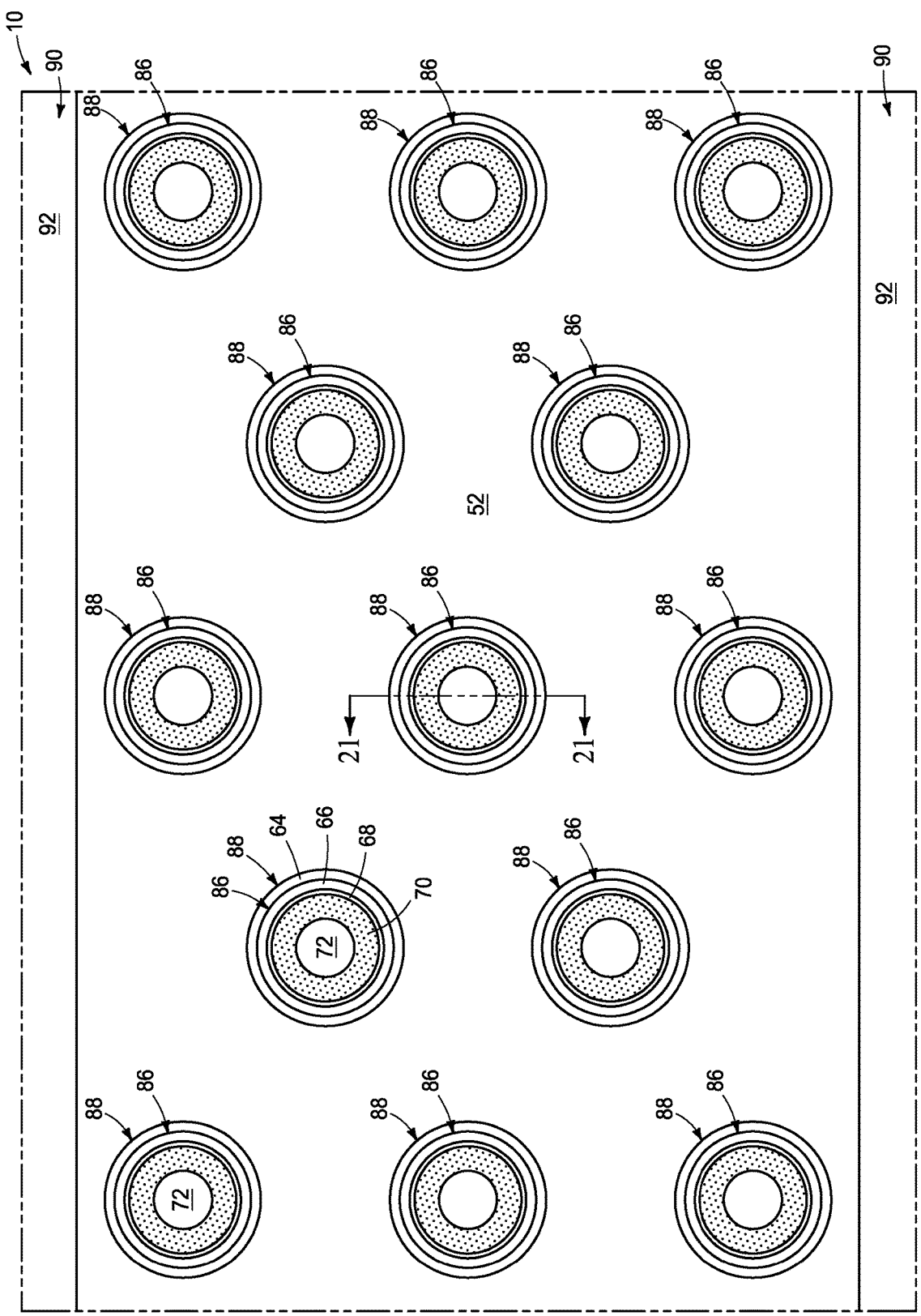
FIG. 22 is a diagrammatic top-down view of a region of the integrated assembly of FIG. 21; with the cross-section of FIG. 21 being along the line 21-21 of FIG. 22.

FIG. 22 shows a top-down view of a region of the memory device 10, and shows a plurality of the pillars 86 packed in a hexagonal arrangement. In the illustrated embodiment, the charge-blocking structures 88 are configured as annular rings; and the materials 66, 68 and 70 of each of the pillars 86 are configured as a concentric arrangement of annular rings surrounded by the associated charge-blocking structure 88.

The view of FIG. 22 shows regions of slits 90 adjacent the hexagonal arrangement of the pillars 86. The slits 90 may be opened and utilized for accessing the materials of the stacks 24 and 48 during the replacement of the sacrificial materials 30 and 50 with the materials 76, 78 and 80. Subsequently, the slits may be filled with the insulative material 92. Such insulative material may comprise any suitable composition(s); and in some embodiments may comprise, consist essentially of, or consist of silicon dioxide.

The configuration of FIG. 22 shows the charge-blocking structures 88 comprising a single uniform composition and thickness through the stacks 24 and 48 of decks 34 and 58. In other embodiments, the charge-blocking structures may comprise different compositions and/or thicknesses within the decks 58 than within the decks 34. Example embodiments are described with reference to FIGS. 23-26.

Figure 23:
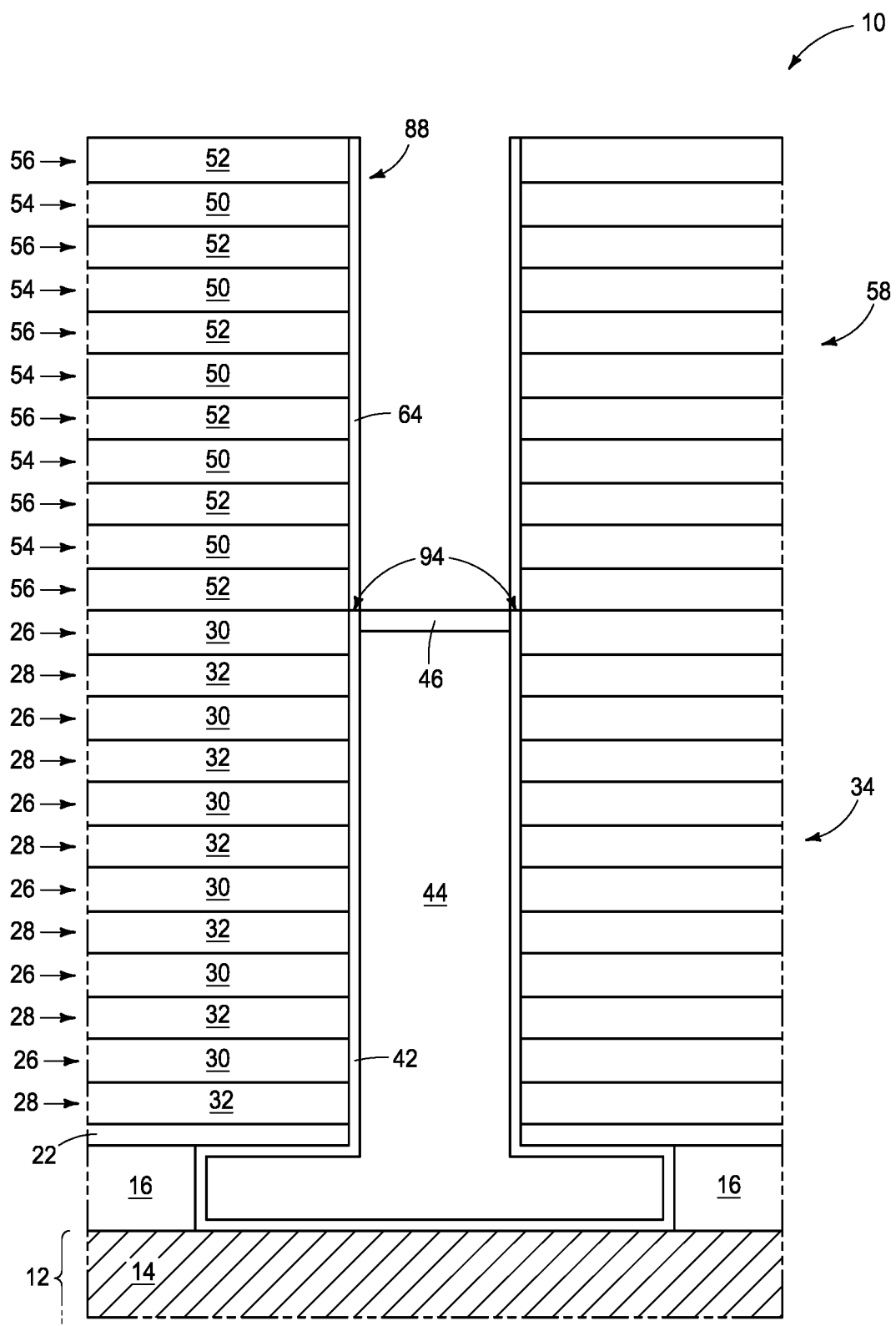
FIG. 23 is a diagrammatic cross-sectional side view of the region of FIG. 15 shown at an example process stage following the process stage of FIG. 15 and alternative to the process stage of FIG. 16.

Referring to FIG. 23, the assembly 10 is shown at a process stage subsequent to that of FIG. 15, and alternative to that of FIG. 16. The charge-blocking material 64 comprises a different composition than the charge-blocking material 42, and accordingly the materials 64 and 42 join at a detectable interface 94. In some embodiments, the materials 42 and 64 may both comprise combinations of the elements corresponding to silicon, oxygen and nitrogen; with the material 64 having a different stoichiometric arrangement of such elements than does the material 42. Such may be accomplished by, for example, utilizing compositionally different precursor materials 40 and 62 for the charge-blocking materials 42 and 64, and/or by utilizing different oxidation conditions to form the charge-blocking material 42 from the precursor material 40 than are utilized for forming the charge-blocking material 64 from the precursor material 62.

The charge-blocking structure 88 of FIG. 23 may be considered to comprise a first composition 42 within the lower deck 34, and a second composition 64 within the upper deck 58; with the second composition being detectably distinguishable from the first composition.

Figure 24:
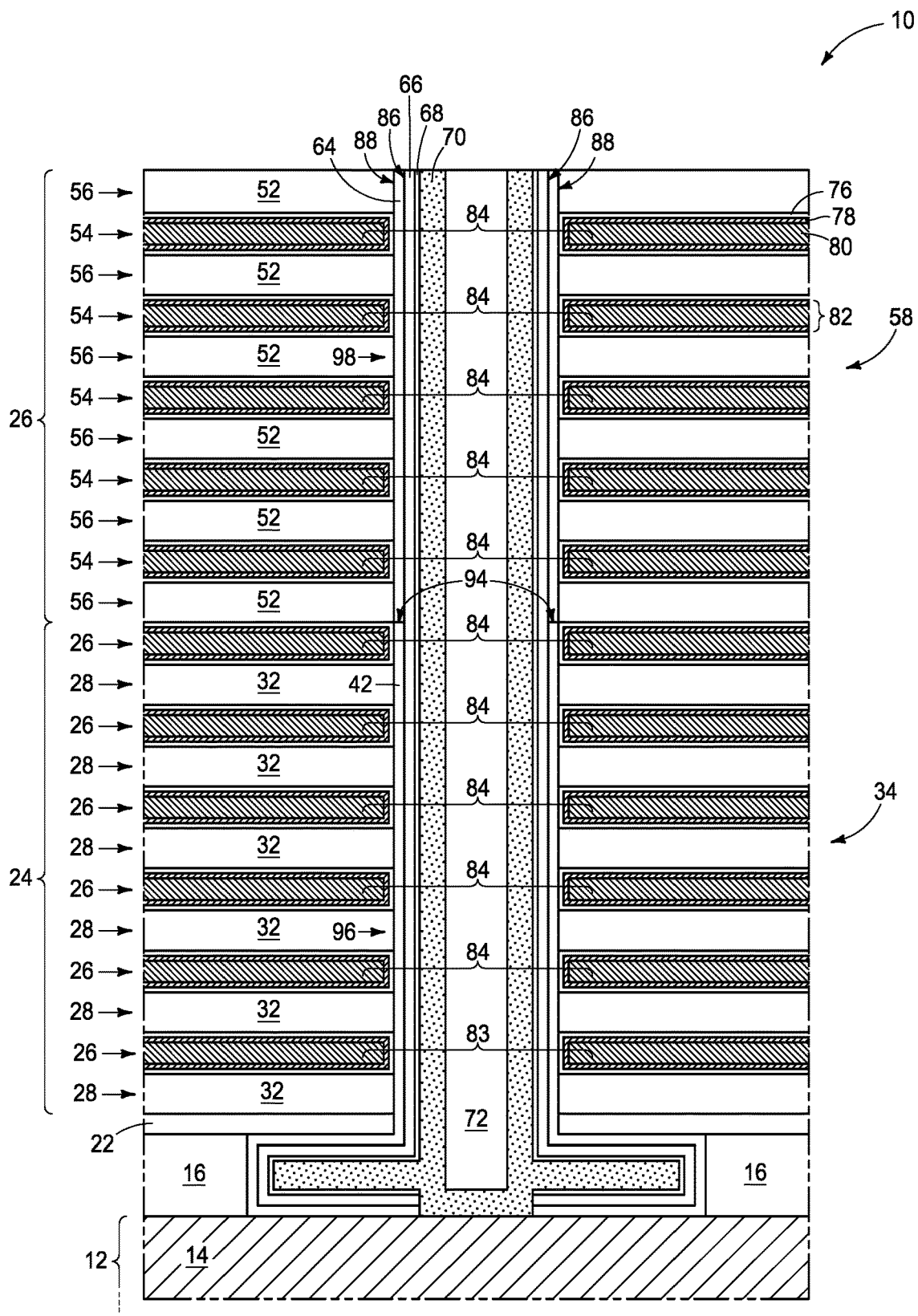
FIG. 24 is a diagrammatic cross-sectional side view of the region of FIG. 23 shown at an example process stage following the process stage of FIG. 23.

Referring to FIG. 24, the assembly 10 of FIG. 23 is subject to processing analogous that described above with reference to FIGS. 17-21 to form the memory cells 84. The assembly 10 of FIG. 24 is similar to that of FIG. 21, and may be considered to correspond to a memory device having vertically-stacked memory cells 84. However, the assembly 10 of FIG. 24 differs from that of FIG. 21 in that the charge-blocking structure 88 comprises a different composition within the upper deck 58 than within the lower deck 34. Such different compositions join to one another at the interface 94. The interface 94 may be detected utilizing appropriate instrumentation and methodology; and may be referred to as a detectable location (or detectable interface).

In some embodiments, the portion of the charge-blocking structure 88 within the lower deck 34 may be considered to comprise a first region 96 having the composition of material 42, and the portion of the charge-blocking structure 88 within the upper deck 58 may be considered to comprise a second region 98 having the composition of material 64.

Figure 25:
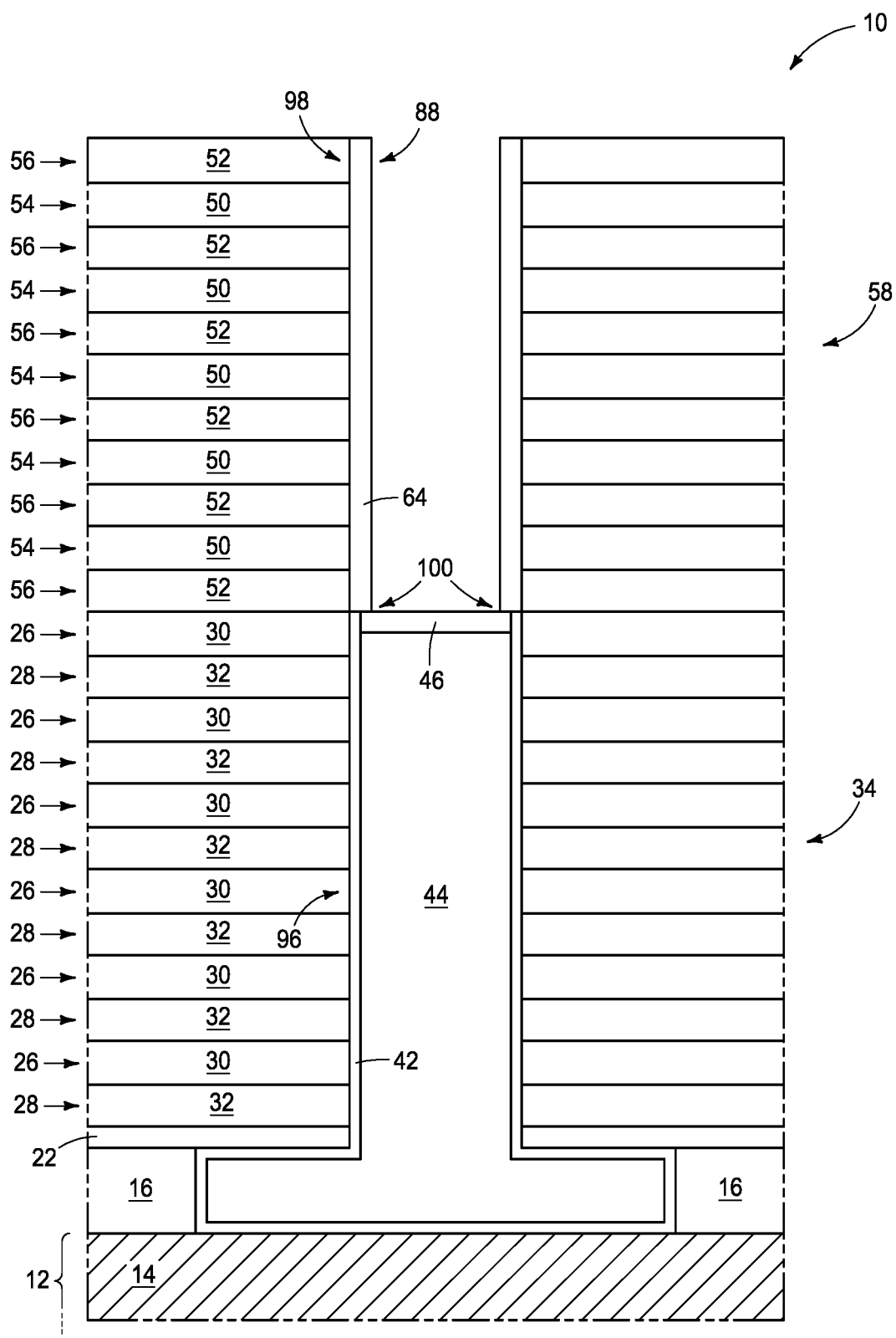
FIG. 25 is a diagrammatic cross-sectional side view of the region of FIG. 15 shown at an example process stage following the process stage of FIG. 15 and alternative to the process stage of FIG. 16.

Referring to FIG. 25, the assembly 10 is shown at another process stage subsequent to that of FIG. 15, and alternative to that of FIG. 16. The charge-blocking material 64 comprises a different lateral thickness than the charge-blocking material 42, and accordingly the materials 64 and 42 join at a detectable location 100. The charge blocking materials 42 and 64 may or may not comprise the same composition(s) as one another. In some embodiments, the different thickness of material 64 relative to material 42 may be accomplished by, for example, utilizing different thicknesses of precursor materials 40 and 62 for the charge-blocking materials 42 and 64, and/or by utilizing different oxidation conditions to form the charge-blocking material 42 from the precursor material 40 than are utilized for forming the charge-blocking material 64 from the precursor material 62. Although the material 64 is shown to be thicker than the material 42, in other embodiments the material 64 may be thinner than the material 42. In some embodiments, the materials 42 and 64 may both have thicknesses within a range of from about 45 Å to about 60 Å.

Figure 26:
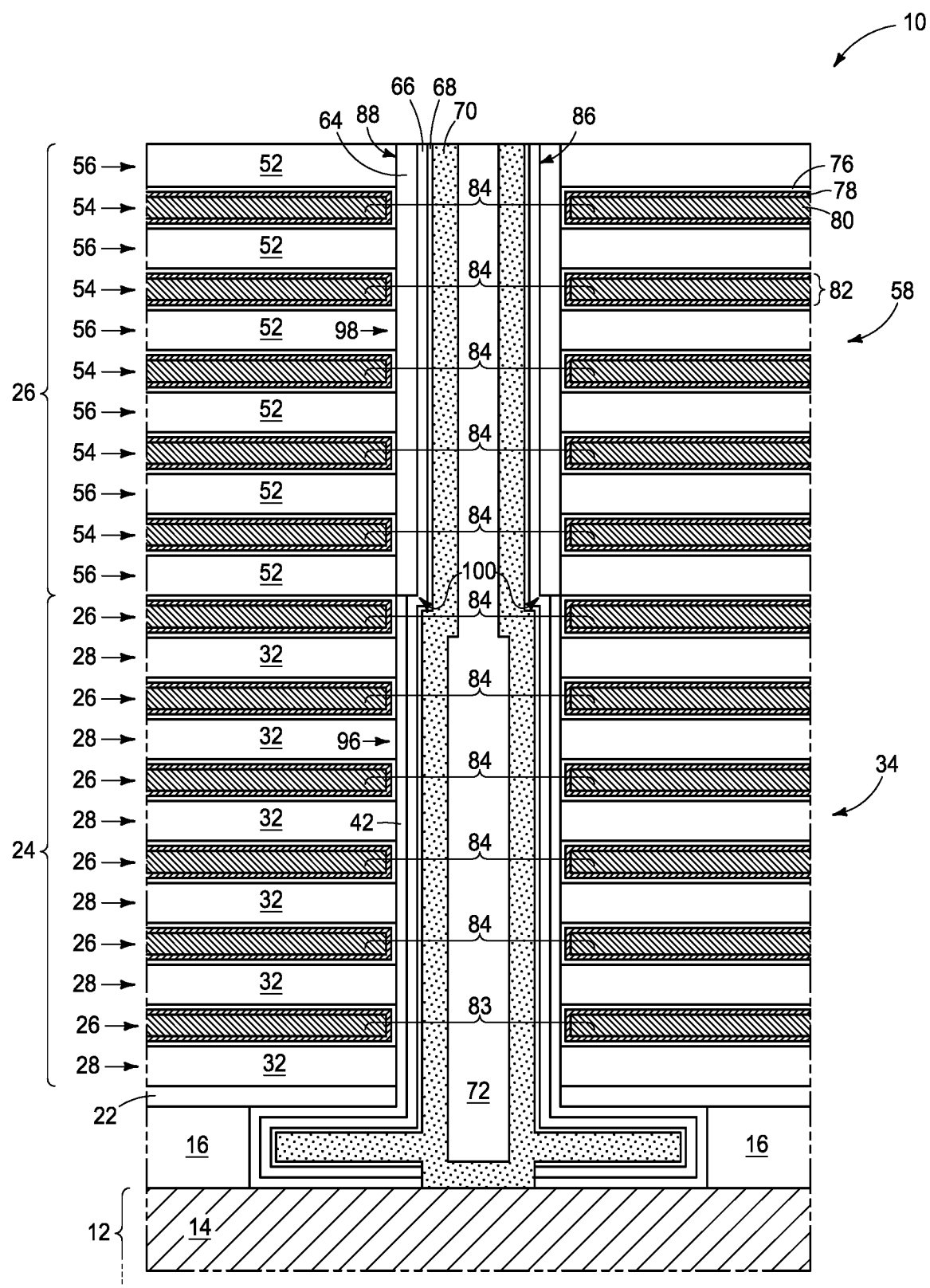
FIG. 26 is a diagrammatic cross-sectional side view of the region of FIG. 25 shown at an example process stage following the process stage of FIG. 25.

Referring to FIG. 26, the assembly 10 of FIG. 25 is subjected to processing analogous that described above with reference to FIGS. 17-21 to form the memory cells 84. The assembly 10 of FIG. 26 is similar to that of FIG. 21, and may be considered to correspond to a memory device having vertically-stacked memory cells 84. However, the assembly 10 of FIG. 26 differs from that of FIG. 21 in that the charge-blocking structure 88 comprises a region 98 of different thickness (and possibly also of different composition) within the upper deck 58 as compared to a region 96 within the lower deck 34. Such different regions join to one another at the detectable location 100.

The memory cells 84 described herein may be operated as part of NAND memory devices. In operation, the charge-storage material (66) may be configured to store information in the memory cells 84. The value (with the term "value" representing one bit or multiple bits) of information stored in an individual memory cell 84 may be based on the amount of charge (e.g., the number of electrons) stored in a charge-storage region of the memory cell. The amount of charge within an individual charge-storage region may be controlled (e.g., increased or decreased) at least in part, based on the value of voltage applied to an associated control gate, and/or based on the value of voltage applied to an associated channel material 70.

The tunneling material 68 may be configured to allow desired tunneling (e.g., transportation) of charge (e.g., electrons) between the charge-storage material 66 and the channel material 70. The tunneling material may be configured (i.e., engineered) to achieve a selected criterion, such as, for example, but not limited to, an equivalent oxide thickness (EOT). The EOT quantifies the electrical properties of the tunneling material, (e.g., capacitance) in terms of a representative physical thickness. For example, EOT may be defined as the thickness of a theoretical silicon dioxide layer that would be required to have the same capacitance density as a given dielectric (e.g., tunneling material 68), ignoring leakage current and reliability considerations.

The charge-blocking material (42, 64) may provide a mechanism to block charge from flowing from the charge-storage material to the control gates.

The dielectric barrier material 76 may be utilized to inhibit back-tunneling of electrons from the control gates toward the charge-storage material.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms first, second, third, fourth, etc., may be utilized to refer to various items (e.g., layers, structures, etc.) in this disclosure and the claims that follow. Such terms are utilized to distinguish items from one another, and are not intended to imply any sequence of deposition/formation of the items except to the extent, if any, that a particular sequence is expressly stated.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an assembly. A first stack of alternating first and second tiers is formed over a conductive structure. The first and second tiers include a first material and an insulative second material. A first opening is formed to extend through the first stack. A sidewall of the first opening is lined with a first liner material. The first liner material is converted to a first charge-blocking material. Sacrificial material is formed within the first opening. A second stack of alternating third and fourth tiers is formed over the first stack and over the sacrificial material. The third and fourth tiers include a third material and an insulative fourth material, respectively. A second opening is formed to extend through the second stack to the sacrificial material. Sidewalls of the second opening are lined with a second liner material (e.g., the second liner material may be deposited within the second opening and then anisotropically etched to leave the second liner material only along the sidewalls of the second opening). The second liner material is converted to a second charge-blocking material. The sacrificial material is removed. Charge-storage material is formed adjacent to the first and second charge-blocking materials. Dielectric material is formed adjacent to the charge-storage material. Channel material is formed adjacent to the dielectric material. At least some of the first and third materials are replaced with one or more conductive materials.

Some embodiments include a method of forming an assembly. A first stack of alternating first and second tiers is formed over a conductive structure. A first opening is formed to extend through the first stack and to an upper surface of the conductive structure. A periphery of the first opening is lined with a first liner material. The first liner material is along sidewalls of the first opening and is along an upper surface of the conductive structure. The first liner material is chemically altered to convert the first liner material to a first charge-blocking material. Sacrificial material is formed within the first opening and along the first charge-blocking material. A second stack of alternating third and fourth tiers is formed over the first stack and over the sacrificial material. A second opening is formed to extend through the second stack to the sacrificial material. Sidewalls of the second opening are lined with a second liner material (e.g., the second liner material may be deposited within the second opening and then anisotropically etched to leave the second liner material only along the sidewalls of the second opening). The second liner material is chemically altered to convert the second liner material to a second charge-blocking material. The sacrificial material is removed, and then charge-storage material is formed along the first and second charge-blocking materials. Dielectric material is formed along the charge-storage material. The first charge-blocking material along the upper surface of the conductive structure is punched through, and then channel material is formed along the dielectric material and is electrically coupled with the conductive structure. One or more conductive materials are formed within the first and third tiers.

Some embodiments include an integrated assembly having a first deck with first memory cells arranged in first tiers disposed one atop another, and having a second deck over the first deck and with second memory cells arranged in second tiers disposed one atop another. A charge-blocking structure extends along the first and second decks. The charge-blocking structure has a first region along the first deck, has a second region along the second deck, and has a detectable location where the first region joins to the second region. A pillar passes through the first and second decks, and is adjacent to the charge-blocking structure. The pillar includes a charge-storage material adjacent to the charge-blocking structure, includes a dielectric material adjacent to the charge-storage material, and includes a channel material adjacent to the dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first deck having first memory cells arranged in first tiers disposed one atop another;
   a second deck over the first deck; the second deck having second memory cells arranged in second tiers disposed one atop another;
   a charge-blocking structure extending along the first and second decks; the charge-blocking structure having a first region along the first deck and a second region along the second deck, and having a detectable location where the first region joins to the second region;
   a pillar passing through the first and second decks and being adjacent the charge-blocking structure; the pillar comprising a charge-storage material adjacent the charge-blocking structure, a dielectric material adjacent the charge-storage material, and a channel material adjacent the dielectric material; and
   wherein the first and second regions of the charge-blocking structure comprise a same composition as one another and comprise different lateral thicknesses relative to one another.

2. The integrated assembly of claim 1 wherein the lateral thicknesses of the first and second regions of the charge-blocking structure are within a range of from about 45 Å to about 60 Å.

3. The integrated assembly of claim 1 wherein the first and second regions of the charge-blocking structure comprise SiON, where the chemical formula indicates primary constituents rather than a specific stoichiometry.

4. The integrated assembly of claim 1 wherein:
the first deck is over a conductive structure;
the channel material is electrically coupled with the conductive structure;
recesses are between the first deck and the conductive structure; and
the charge-storage material, dielectric material and channel material of the pillars extend into said recesses.

5. The integrated assembly of claim 4 wherein the conductive structure comprises conductively-doped silicon, and wherein the channel material is directly against the conductively-doped silicon of the conductive structure.

6. The integrated assembly of claim 1 wherein the charge-storage material comprises silicon nitride.

7. The integrated assembly of claim 1 wherein the first and second regions of the charge-blocking structure comprise SiON, where the chemical formula indicates primary constituents rather than a specific stoichiometry, the first region comprising a stoichiometry different from a stoichiometry of the second region.

8. The integrated assembly of claim 1 wherein the first and second regions of the charge-blocking structure comprise SiON, where the chemical formula indicates primary constituents rather than a specific stoichiometry, the first region comprising a stoichiometry the same as a stoichiometry of the second region.

9. An integrated assembly, comprising:
a first deck having first memory cells arranged in first tiers disposed one atop another;
a second deck over the first deck; the second deck having second memory cells arranged in second tiers disposed one atop another;
a charge-blocking structure extending along the first and second decks; the charge-blocking structure having a first region along the first deck and a second region along the second deck, and having a detectable location where the first region joins to the second region;
a pillar passing through the first and second decks and being adjacent the charge-blocking structure; the pillar comprising a charge-storage material adjacent the charge-blocking structure, a dielectric material adjacent the charge-storage material, and a channel material adjacent the dielectric material; and
wherein the first and second regions of the charge-blocking structure comprise different compositions relative to one another.

10. An integrated assembly, comprising:
a first deck having first memory cells arranged in first tiers disposed one atop another;
a second deck over the first deck; the second deck having second memory cells arranged in second tiers disposed one atop another;
a charge-blocking structure extending along the first and second decks; the charge-blocking structure having a first region along the first deck and a second region along the second deck, and having a detectable location where the first region joins to the second region;
a pillar passing through the first and second decks and being adjacent the charge-blocking structure; the pillar comprising a charge-storage material adjacent the charge-blocking structure, a dielectric material adjacent the charge-storage material, and a channel material adjacent the dielectric material; and
wherein the first and second regions of the charge-blocking structure comprise SiON, where the chemical formula indicates primary constituents rather than a specific stoichiometry, the first region comprising a stoichiometry different from a stoichiometry of the second region.

\* \* \* \* \*